(12) United States Patent
Kim et al.

(10) Patent No.: US 9,570,666 B2
(45) Date of Patent: *Feb. 14, 2017

(54) SILICON-BASED COOLING PACKAGE FOR LIGHT-EMITTING DEVICES

(71) Applicants: Gerald Ho Kim, Carlsbad, CA (US); Jay Eunjae Kim, Bellevue, WA (US)

(72) Inventors: Gerald Ho Kim, Carlsbad, CA (US); Jay Eunjae Kim, Bellevue, WA (US)

(*) Notice: Subject to any disclaimer, the term of this patent is extended or adjusted under 35 U.S.C. 154(b) by 100 days.

This patent is subject to a terminal disclaimer.

(21) Appl. No.: 14/324,225

(22) Filed: Jul. 6, 2014

(65) Prior Publication Data

US 2014/0321489 A1 Oct. 30, 2014

Related U.S. Application Data

(63) Continuation-in-part of application No. 13/359,592, filed on Jan. 27, 2012, now Pat. No. 8,770,823.

(51) Int. Cl.
| | |
|---|---|
| *H01L 33/64* | (2010.01) |
| *H01S 5/024* | (2006.01) |
| *H01L 33/48* | (2010.01) |
| *H01S 5/183* | (2006.01) |
| *H01S 5/42* | (2006.01) |

(52) U.S. Cl.
CPC ......... *H01L 33/641* (2013.01); *H01S 5/02469* (2013.01); *H01S 5/02476* (2013.01); *H01L 33/483* (2013.01); *H01S 5/02407* (2013.01); *H01S 5/18388* (2013.01); *H01S 5/423* (2013.01)

(58) Field of Classification Search
USPC .................................. 362/646, 249.02, 97.3
See application file for complete search history.

(56) References Cited

U.S. PATENT DOCUMENTS

| 8,338,840 | B2* | 12/2012 | Lerman | ............... | H01L 25/0753 257/100 |
|---|---|---|---|---|---|
| 8,338,841 | B2* | 12/2012 | Lerman | ............... | H01L 25/0753 257/100 |
| 8,354,686 | B2* | 1/2013 | Jin | ............................ | F21K 9/00 257/97 |
| 8,770,823 | B2* | 7/2014 | Kim | ...................... | H01L 33/641 362/249.02 |
| 2007/0217202 | A1* | 9/2007 | Sato | ..................... | G02B 6/0085 362/294 |

(Continued)

*Primary Examiner* — Laura Tso
(74) *Attorney, Agent, or Firm* — Andy M. Han

(57) ABSTRACT

Various embodiments of a thermal energy transfer apparatus that removes thermal energy from a light-emitting device are described. In one aspect, an apparatus comprises a non-metal base plate and a silicon-based cover element disposed on the base plate. The base plate is coated with a first electrically-conductive pattern that forms a first electrode. The base plate is further coated with a second electrically-conductive pattern that is electrically isolated from the first electrically-conductive pattern. The cover element holds the one or more light-emitting devices between the base plate and the cover element with at least a portion of a light-emitting surface of each of the one or more light-emitting devices exposed. The cover element is coated with a third electrically-conductive pattern that is in contact with the second electrically-conductive pattern to form a second electrode when the cover element is disposed on the base plate.

13 Claims, 21 Drawing Sheets

(56) References Cited

U.S. PATENT DOCUMENTS

| | | | | |
|---|---|---|---|---|
| 2008/0094835 A1* | 4/2008 | Marra | ................. | F21K 9/54 |
| | | | | 362/247 |
| 2009/0001558 A1* | 1/2009 | Shiau | ................. | F21L 4/027 |
| | | | | 257/712 |
| 2009/0080487 A1* | 3/2009 | Onishi | ................. | H01S 5/18308 |
| | | | | 372/50.11 |
| 2011/0075438 A1* | 3/2011 | Shirai | ................. | F21K 9/00 |
| | | | | 362/538 |
| 2011/0090691 A1* | 4/2011 | Markle | ................. | F21K 9/00 |
| | | | | 362/249.02 |
| 2011/0310604 A1* | 12/2011 | Shimizu | ................. | F21K 9/30 |
| | | | | 362/235 |
| 2011/0310609 A1* | 12/2011 | Kawashima | ................. | F21V 19/0055 |
| | | | | 362/249.02 |
| 2011/0317412 A1* | 12/2011 | Paik | ................. | F21S 48/328 |
| | | | | 362/235 |
| 2012/0002421 A1* | 1/2012 | Takahasi | ................. | F21K 9/1355 |
| | | | | 362/249.02 |

* cited by examiner

SILICON-BASED COOLING PACKAGE FOR LIGHT-EMITTING DEVICES

CROSS-REFERENCE TO RELATED APPLICATION

This application is continuation-in-part (CIP) and claims the priority benefit of U.S. patent application Ser. No. 13/359,592, filed on Jan. 27, 2012 and claiming the priority benefit of U.S. Provisional Patent Application No. 61/437,598, filed on Jan. 29, 2011. The above-listed applications are hereby incorporated by reference in their entirety.

TECHNICAL FIELD

The present disclosure generally relates to the field of transfer of thermal energy and, more particularly, to removal of thermal energy from a light-emitting device.

BACKGROUND

Light-emitting devices, such as vertical-cavity surface-emitting lasers (VCSEL), light-emitting diodes (LED), laser diodes and the like, generate thermal energy, or heat, when in operation. The heat generated by a light-emitting device needs to be removed, or dissipated, from the light-emitting device in order to allow the light-emitting device to achieve optimum performance while keeping the light-emitting device within a safe operating temperature range. With the form factor of light-emitting devices and the applications they are implemented in becoming ever more compact, it is imperative to effectively dissipate the high-density heat generated in an area of small footprint to ensure the safe operation and optimum performance of light-emitting devices.

Many metal-based heat dissipation packages, whether water-cooled or air-cooled, have been developed for use in compact packages to dissipate heat generated by light-emitting devices. For instance, heat exchangers and heat pipes made of a material with high thermal conductivity, such as copper, copper-tungsten alloy, aluminum or iron, for example, are commercially available. However, most metal-based heat exchangers and heat pipes experience oxidation, corrosion and/or crystallization after long periods of operation. Such fouling factors significantly reduce the efficiency of heat transfer of metal-based cooling packages. Other problems associated with metal-based cooling packages include, for example, difficulty in precision alignment in mounting laser diode bars, VCSELs or LEDs or chips in laser diode/VCSEL/LED cooling applications, issues with overall compactness of the package, corrosion of the metallic material in water-cooled applications, difficulty in manufacturing, etc. Yet, increasing demand for higher power density in small form factor motivates the production of a compact cooling package with fewer or none of the aforementioned issues. Moreover, conventional packages typically use wire bonding to provide electrical power to the light-emitting device, but wire bonding may add cost and complexity in manufacturing and may be prone to defects in addition to occupying space unnecessarily.

SUMMARY

This section highlights select features of the present disclosure, and is not to be interpreted as limiting scope of the claimed subject matter. Various embodiments of a silicon-based thermal energy transfer apparatus, or a cooling package, for light-emitting devices are described herein. The novel and non-obvious silicon-based thermal energy transfer apparatus provides a compact form factor, achieves better thermal conductivity than conventional metal-based cooling packages, and is more cost effective. The thermal energy transfer apparatus advantageously removes thermal energy from a light-emitting device and allows electrical power to be provided to the light-emitting device without using wire bonding.

According to one aspect, an apparatus may include a non-metal base plate and a silicon-based cover element. The base plate may be configured to receive one or more light-emitting devices therein. A first area of the base plate may be coated with a first electrically-conductive pattern that forms a first electrode for powering the one or more light-emitting devices. A second area of the base plate may be coated with a second electrically-conductive pattern that is electrically isolated from the first electrically-conductive pattern. The cover element may be configured to be disposed on the base plate to hold the one or more light-emitting devices between the base plate and the cover element with at least a portion of a light-emitting surface of each of the one or more light-emitting devices exposed. An area of the cover element may be coated with a third electrically-conductive pattern that is in contact with the second electrically-conductive pattern to form a second electrode together with the second electrically-conductive pattern for powering the one or more light-emitting devices when the cover element is disposed on the base plate.

In some embodiments, the base plate may include silicon, metal-core printed circuit board (PCB), ceramics, diamond, carbon-fiber, nanotubes, or thermally-conducting crystal.

In some embodiments, the cover element may have a first primary surface and a second primary surface opposite the first primary surface thereof with the first primary surface of the cover element facing the base plate and the one or more light-emitting devices. The second primary surface of the cover element may include a plurality of grooves.

In some embodiments, the base plate may include a first primary surface and a second primary surface opposite to the first primary surface. The first primary surface may include: a non-recessed area and a recess configured to receive the one or more light-emitting devices in the recess, at least a portion of the recess and a first portion of the non-recessed area contiguously coated with the first electrically-conductive pattern, and a second portion of the non-recessed area coated with the second electrically-conductive pattern. The cover element may include a first primary surface and a second primary surface opposite to the first primary surface. The first primary surface of the cover element may be coated with the third electrically-conductive pattern that is configured to be in contact with the second electrically-conductive pattern when the cover element is disposed on the base plate with the first primary surface of the cover element facing the first primary surface of the base plate.

In some embodiments, the recess may include a main portion and a channel portion with the main portion dimensioned to receive the one or more light-emitting devices therein. A first part of the first electrically-conductive pattern may be disposed in the main portion and the channel portion of the recess. A second part of the first electrically-conductive pattern that is contiguous with the first part of the first electrically-conductive pattern may be disposed on the first portion of the non-recessed area of the first primary surface of the base plate. The cover element may be configured to be not in contact with the second part of the first electrically-conductive pattern when the cover element is disposed on the base plate.

In some embodiments, the apparatus may further include a layer of thermally-conductive material disposed on a non-recessed area of the base plate and configured to be in contact with the cover element when the cover element is disposed on the base plate such that the layer of thermally-conductive material functions as a thermal path to transfer thermal energy between the cover element and the base plate.

In some embodiments, the layer of thermally-conductive material may include diamond, copper, tin, silver or carbon nanotubes.

In some embodiments, the apparatus may further include a layer of metallic material disposed on at least a portion of the second primary surface of the base plate. The metallic material may bond the base plate to an external object.

In some embodiments, the apparatus may further include a collimating element disposed on the cover element. The collimating element may include a lens portion that collimates light emitted from the one or more light-emitting devices along a predefined direction.

In some embodiments, the collimating element may be made of glass, polymer, or quartz.

In some embodiments, the apparatus may further include a spacer element disposed on the collimating element with the collimating element disposed between the spacer element and the cover element. The spacer element may include an opening that accommodates at least the lens portion of the collimating element and may allow the light emitted from the one or more light-emitting devices to propagate through the spacer element.

In some embodiments, the spacer element may be made of silicon or ceramic.

In some embodiments, the apparatus may further include a window element disposed on the spacer element with the spacer element disposed between the window element and the collimating element. The window element may be substantially transparent.

In some embodiments, the apparatus may further include the one or more light-emitting devices received on the base plate. The one or more light-emitting devices may be disposed between the base plate and the cover element and configured to receive electrical power from the first electrode and the second electrode to emit light. The one or more light-emitting devices may include one or more vertical-cavity surface-emitting laser (VCSEL) or one or more light-emitting diodes (LED).

In some embodiments, the apparatus may further include an integrated circuit (IC) device disposed on the base plate and configured to receive electrical power from the first electrode and the second electrode to control operations of the one or more light-emitting devices.

In some embodiments, the apparatus may further include a silicon-based heat sink disposed on the IC device. The heat sink may include a first primary surface and a second primary surface opposite the first primary surface thereof with the first primary surface of the heat sink facing the IC device. The second primary surface of the heat sink may include a plurality of grooves.

According to another aspect, an apparatus may include a silicon-based cover element and a non-metal base plate. The cover element may include a recess configured to receive one or more light-emitting devices therein. The cover element may further include one or more openings such that at least a portion of a light-emitting surface of each of the one or more light-emitting devices is exposed when the one or more light-emitting devices are received in the one or more recesses of the cover element. The one or more light-emitting devices and the cover element may be disposed on the base plate with the one or more light-emitting devices sandwiched between the cover element and the base plate. A first area of the base plate may be coated with a first electrically-conductive pattern that forms a first electrode for powering the one or more light-emitting devices. A second area of the base plate may be coated with a second electrically-conductive pattern that is electrically isolated from the first electrically-conductive pattern. An area of the cover element may be coated with a third electrically-conductive pattern that is in contact with the second electrically-conductive pattern to form a second electrode together with the second electrically-conductive pattern for powering the one or more light-emitting devices when the cover element is disposed on the base plate.

In some embodiments, the base plate may include silicon, metal-core printed circuit board (PCB), ceramics, diamond, carbon-fiber, nanotubes, or thermally-conducting crystal. The cover element may include a first primary surface and a second primary surface opposite the first primary surface thereof with the first primary surface of the cover element facing the base plate and the one or more light-emitting devices. The second primary surface of the cover element may include a plurality of grooves.

In some embodiments, the apparatus may further include the one or more light-emitting devices, an IC device, and a silicon-based heat sink. The one or more light-emitting devices may be received in the recess of the cover element. The one or more light-emitting devices may be disposed between the base plate and the cover element and configured to receive electrical power from the first electrode and the second electrode to emit light. The one or more light-emitting devices may include one or more VCSEL or one or more LED. The IC device may be disposed on the base plate and configured to receive electrical power from the first electrode and the second electrode to control operations of the one or more light-emitting devices. The heat sink may be disposed on the IC device. The heat sink may include a first primary surface and a second primary surface opposite the first primary surface thereof with the first primary surface of the heat sink facing the IC device. The second primary surface of the heat sink may include a plurality of grooves.

According to yet another aspect, an apparatus may include one or more light-emitting devices, a base plate, a cover element, a layer of thermally-conductive material, an IC device, and a heat sink. The base plate may be made of an electrically-insulating and thermally-conductive material. The base plate may include a first primary surface and a second primary surface opposite to the first primary surface. The first primary surface may include a non-recessed area and a recess configured to receive the one or more light-emitting devices in the recess. At least a portion of the recess and a first portion of the non-recessed area may be contiguously coated with a first electrically-conductive pattern that forms a first electrode for powering the light-emitting diode. A second portion of the non-recessed area may be coated with a second electrically-conductive pattern that is electrically isolated from the first electrically-conductive pattern. The cover element may be made of a silicon-based material or a ceramic material. The cover element may be configured to be disposed on the base plate to hold the one or more light-emitting devices between the base plate and the cover element with at least a portion of a light-emitting surface of each of the one or more light-emitting devices exposed. The cover element may include a first primary surface and a second primary surface opposite to the first primary surface. The first primary surface of the cover element may be coated with a third electrically-conductive pattern. The third electrically-conductive pattern may be configured to be in contact with the second electrically-conductive pattern to form a second electrode for powering the light-emitting device when the cover element is disposed on the base plate with the first primary surface of the cover element facing the first primary surface of the base plate. The second primary surface of the cover element may include a plurality of first grooves. The layer of thermally-conductive material may be disposed on the non-recessed area of the base plate and configured to be in contact with the cover element when the cover element is disposed on the base plate such that the layer of thermally-conductive material functions as a thermal path to transfer thermal energy between the cover element and the base plate. The IC device may be disposed on the base plate and configured to receive electrical power from the first electrode and the second electrode to control operations of the one or more light-emitting devices. The heat sink may be made of a silicon-based material or a ceramic material. The heat sink may be disposed on the IC device. The heat sink may include a first primary surface and a second primary surface opposite the first primary surface thereof with the first primary surface of the heat sink facing the IC device. The second primary surface of the heat sink may include a plurality of second grooves.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations since various changes and modifications will become apparent to those skilled in the art from the following detailed description. The use of the same reference numbers in different indicates similar or identical items. It is appreciable that the figures are not necessarily in scale as some components may be shown as out of proportion than the size in actual implementation in order to clearly illustrate the concept of the present disclosure.

DETAILED DESCRIPTION

Overview

The present disclosure describes embodiments of a thermal energy transfer apparatus that removes thermal energy from a light-emitting device and allows electrical power to be provided to the light-emitting device without using wire bonding. While aspects of described techniques relating to a thermal energy transfer apparatus that removes thermal energy from a light-emitting device can be implemented in any number of different applications, the disclosed embodiments are described in context of the following exemplary configurations.

Figure 21:
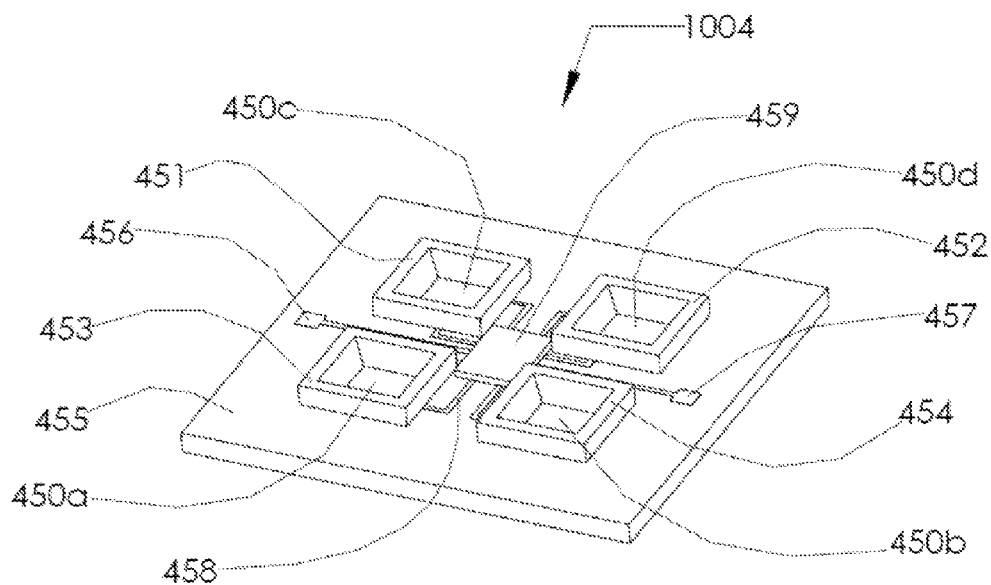
FIG. 21 illustrates a perspective view of a thermal energy transfer apparatus for one or more light-emitting devices in accordance with an embodiment of the present disclosure.
Figure 22:
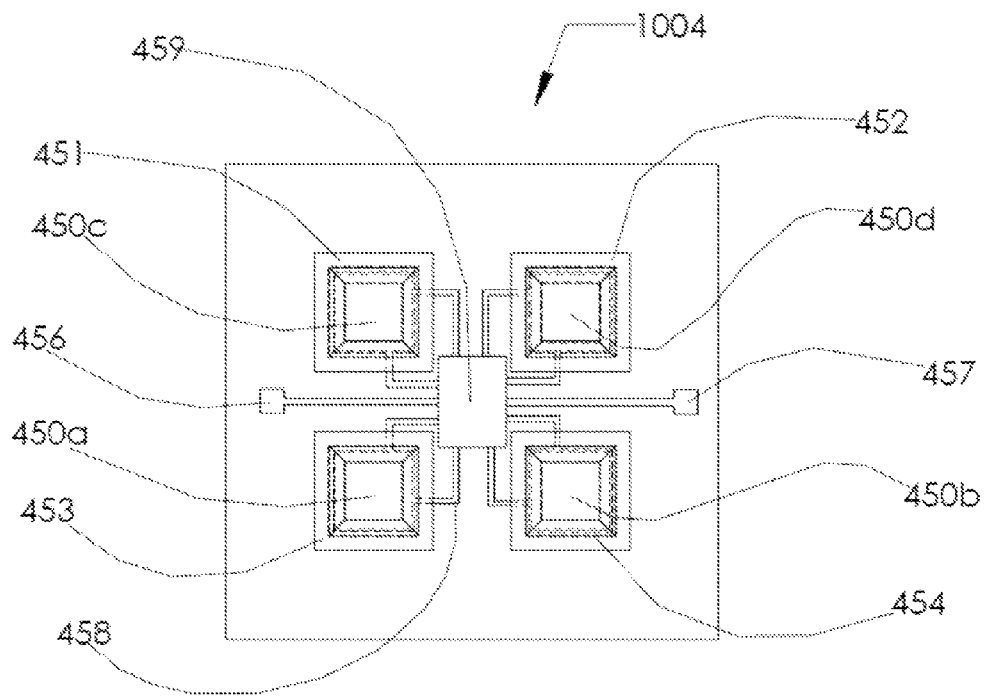
FIG. 22 illustrates a top view of the thermal energy transfer apparatus of FIG. 21.
Figure 23:
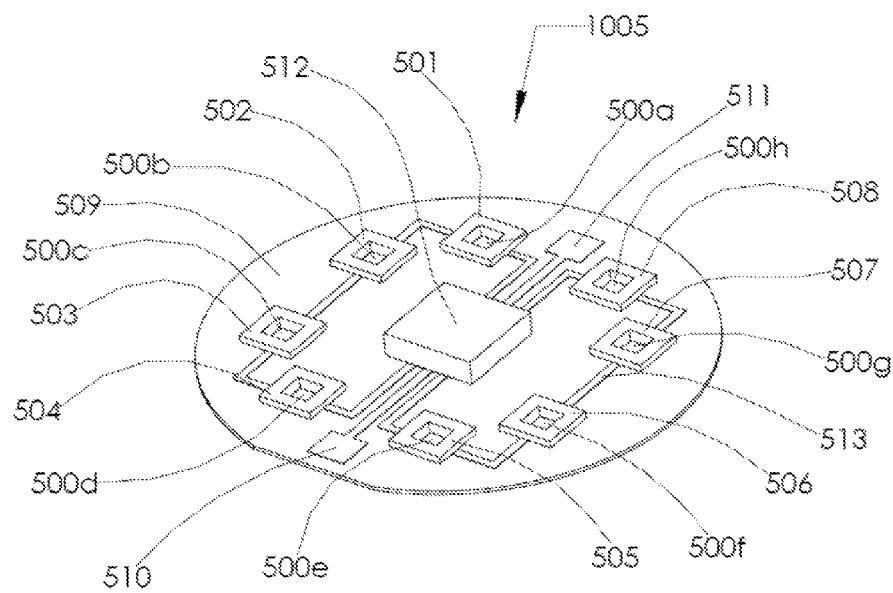
FIG. 23 illustrates a perspective view of a thermal energy transfer apparatus for one or more light-emitting devices in accordance with another embodiment of the present disclosure.
Figure 24:
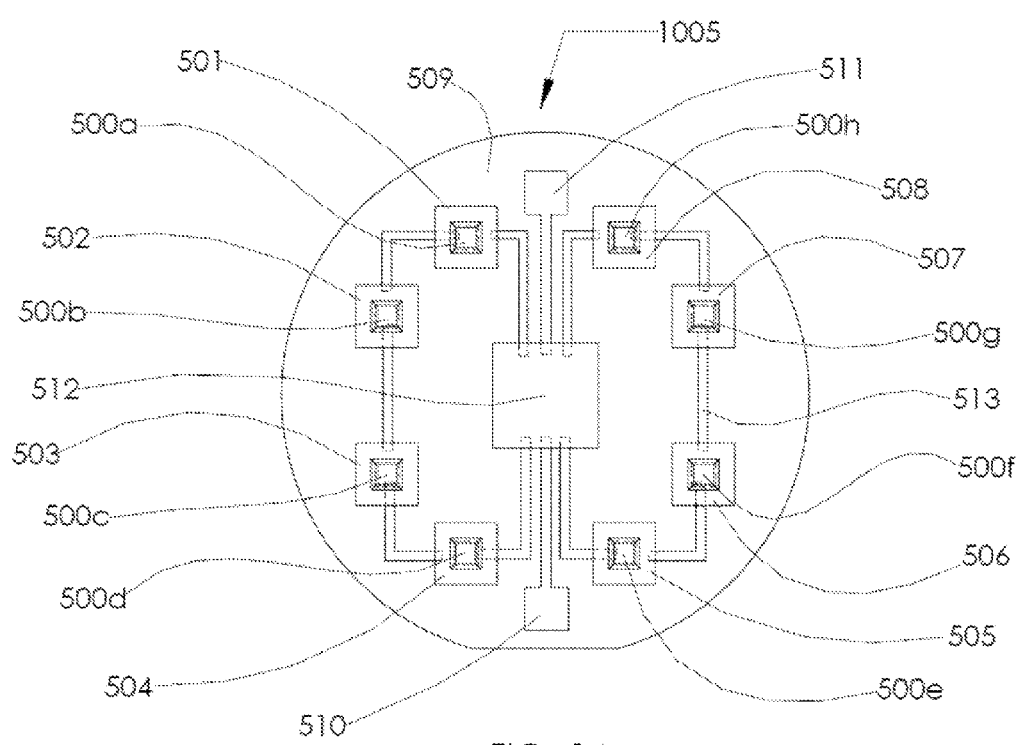
FIG. 24 illustrates a top view of the thermal energy transfer apparatus of FIG. 23.
Figure 25:
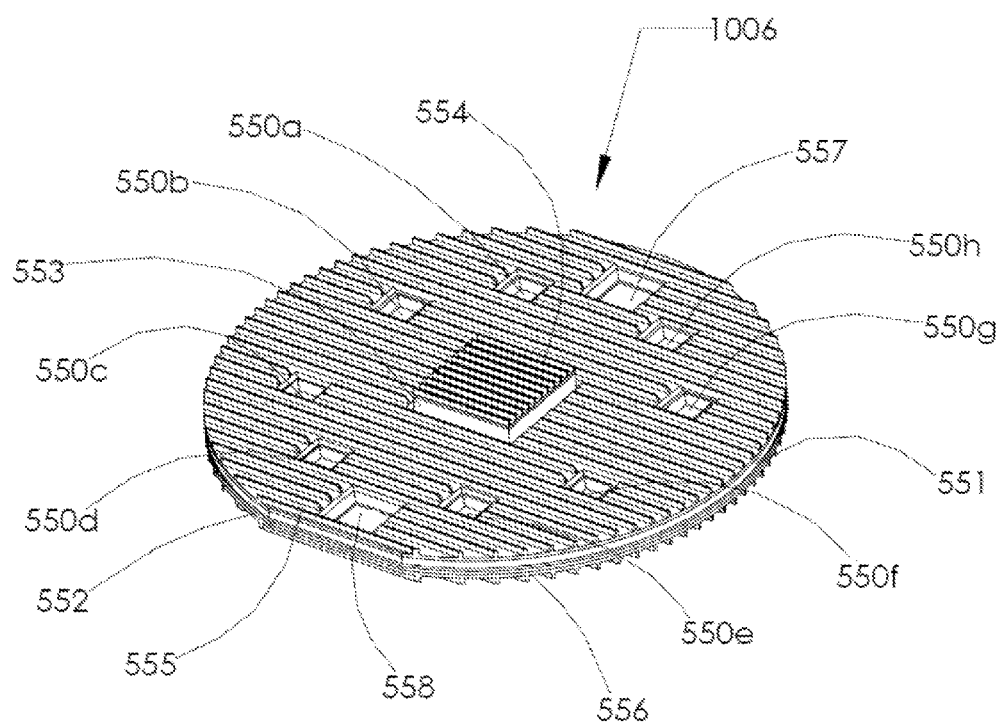
FIG. 25 illustrates a perspective view of a thermal energy transfer apparatus for one or more light-emitting devices in accordance with yet another embodiment of the present disclosure.
Figure 26:
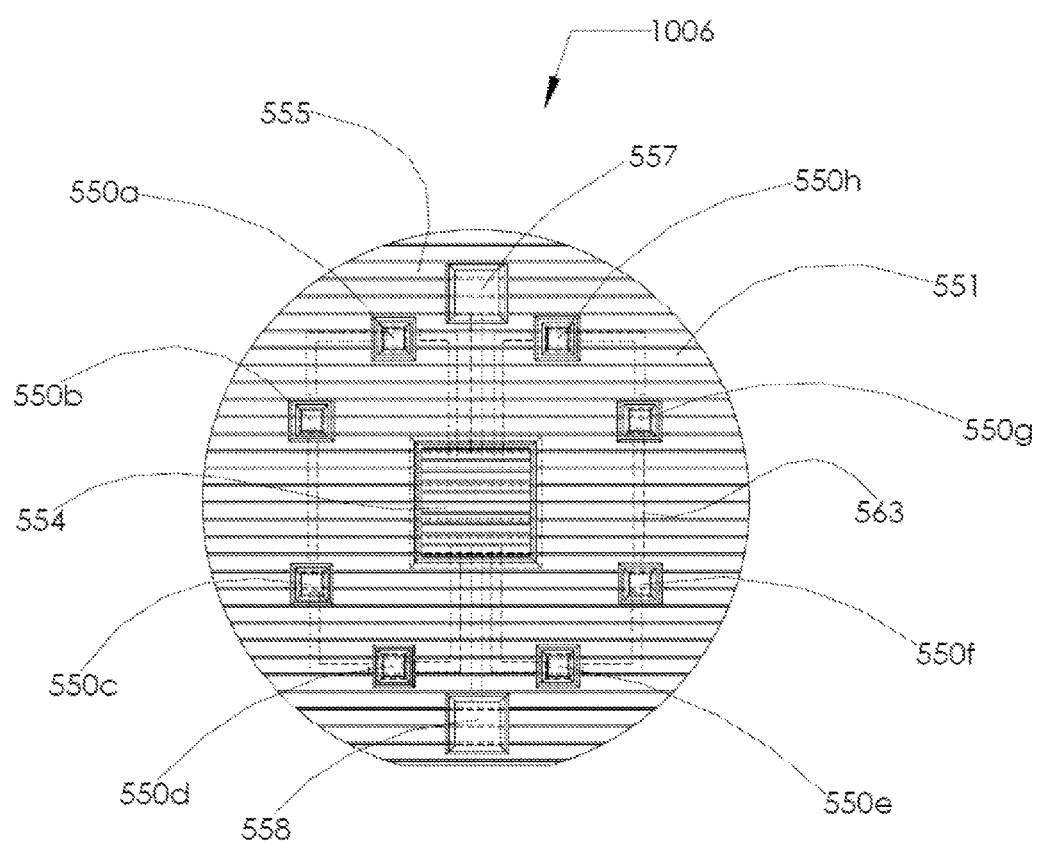
FIG. 26 illustrates a top view of the thermal energy transfer apparatus of FIG. 25.
Figure 27:
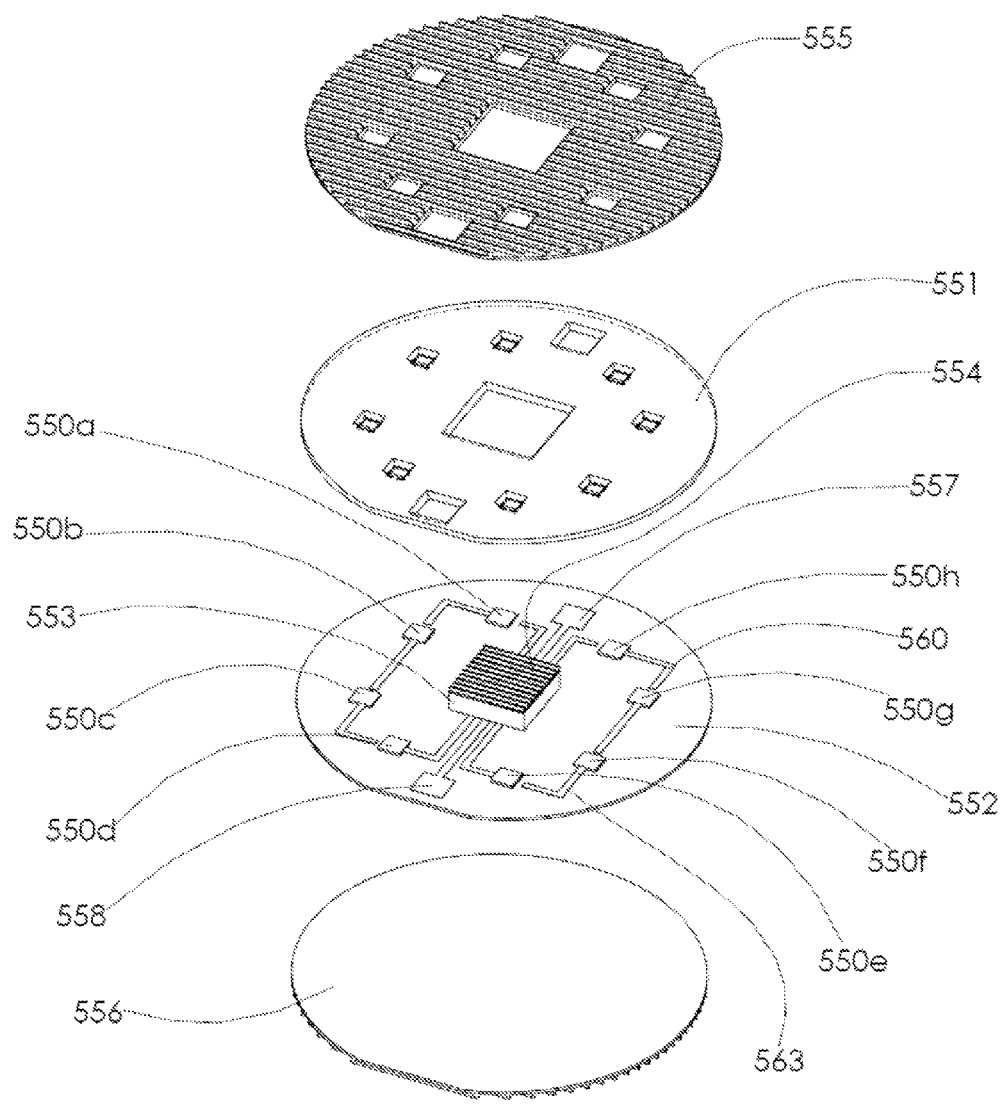
FIG. 27 illustrates an exploded view of the thermal energy transfer apparatus of FIG. 25.

FIGS. 1-9 illustrate examples of thermal energy transfer apparatuses for a single light-emitting device. FIGS. 10-27 illustrate examples of thermal energy transfer apparatuses for multiple light-emitting devices. More specifically, FIGS. 10-20 illustrate various example designs to accommodate a multi-light-emitting-device package with single silicon cover element or quad-silicon cover elements. FIGS. 21 and 22 illustrate a multi-light-emitting-device package integrated with a driver/controller and disposed on a base plate, with each light-emitting device covered by a respective silicon cover element. FIGS. 23 and 24 illustrate a large scale light-emitting device package integrated with a driver/controller and disposed on a whole silicon wafer, with each light-emitting device covered by a respective silicon cover element. FIG. 25-27 illustrate a wafer-level package with silicon heat sinks for a high-power multi-light-emitting-device package integrated with a driver/controller. It would be appreciated that, although various example designs that accommodate a quad-light-emitting-device package are shown in FIGS. 10-27, the principle and scope of the present disclosure also extend to designs that accommodate different numbers of light-emitting devices (e.g., two, three, five, six, eight, twelve, sixteen, and so on).

In the various designs, the light-emitting devices are connected with corresponding silicon cover elements that provide not only electrical connection to provide electrical power to the light-emitting devices but also thermal path to transfer heat away from the light-emitting devices. That is, each cover element provides a function in the context of thermal management with respect to the light-emitting devices, and may be constructed of single-crystal silicon. The high-precision etched cover element(s) and base plate in each design provide accurate alignment to allow automated mass production and assembly of the thermal energy transfer apparatuses with light-emitting devices packaged therein.

The multi-light-emitting-device packages of the various examples of the present disclosure provide an illumination source for general lighting or special-purpose high-power lighting for commercial, industrial and/or military applications. In various implementations, one or more light-emitting devices may be LED or substituted with VCSEL or other laser source to provide an illumination source for time-of-flight applications or other high-power applications.

Illustrative First Thermal Energy Transfer Apparatus

Figure 1:
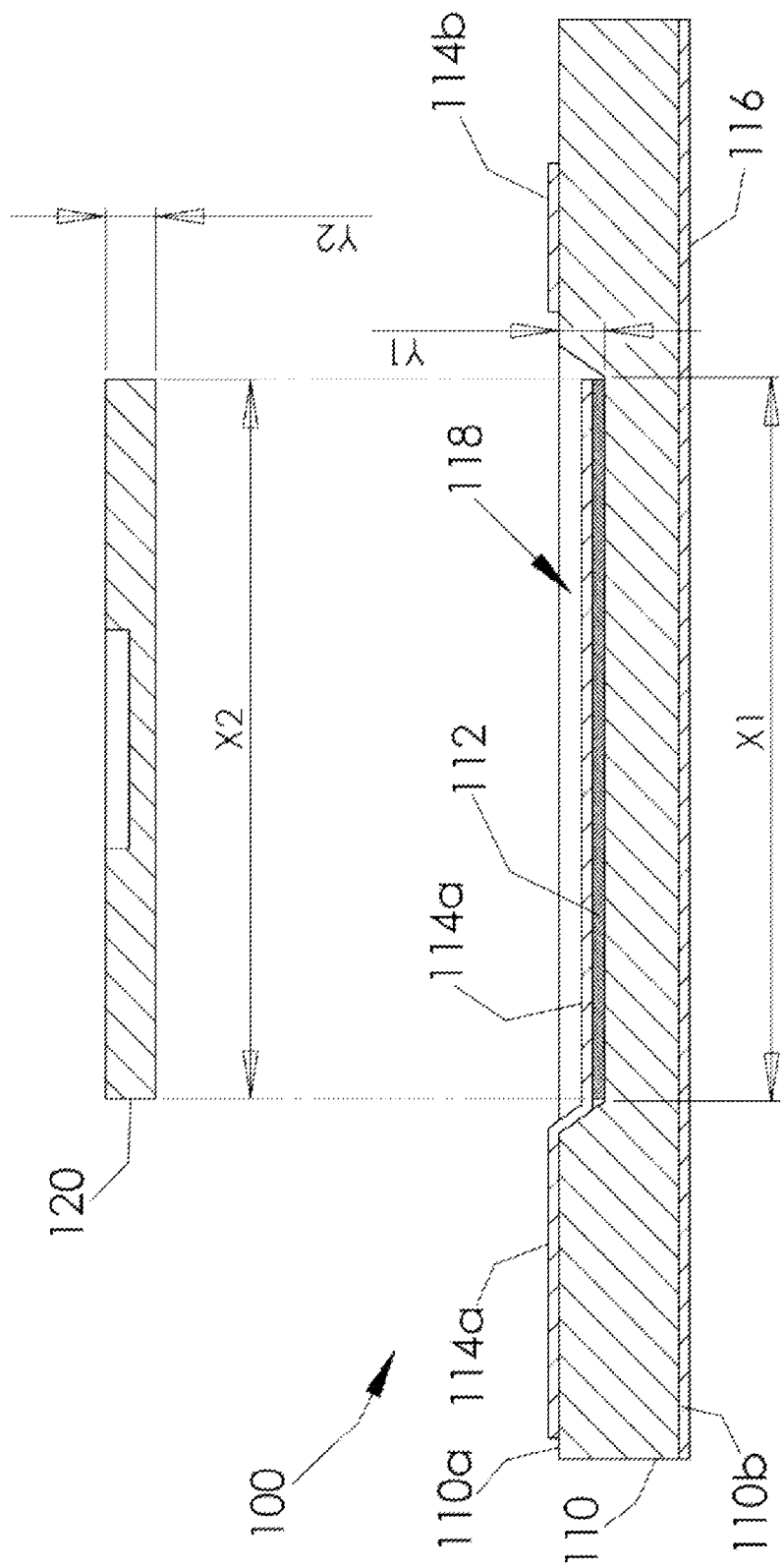
FIG. 1 illustrates a side view of a thermal energy transfer apparatus for a light-emitting device in accordance with one embodiment of the present disclosure.
Figure 2:
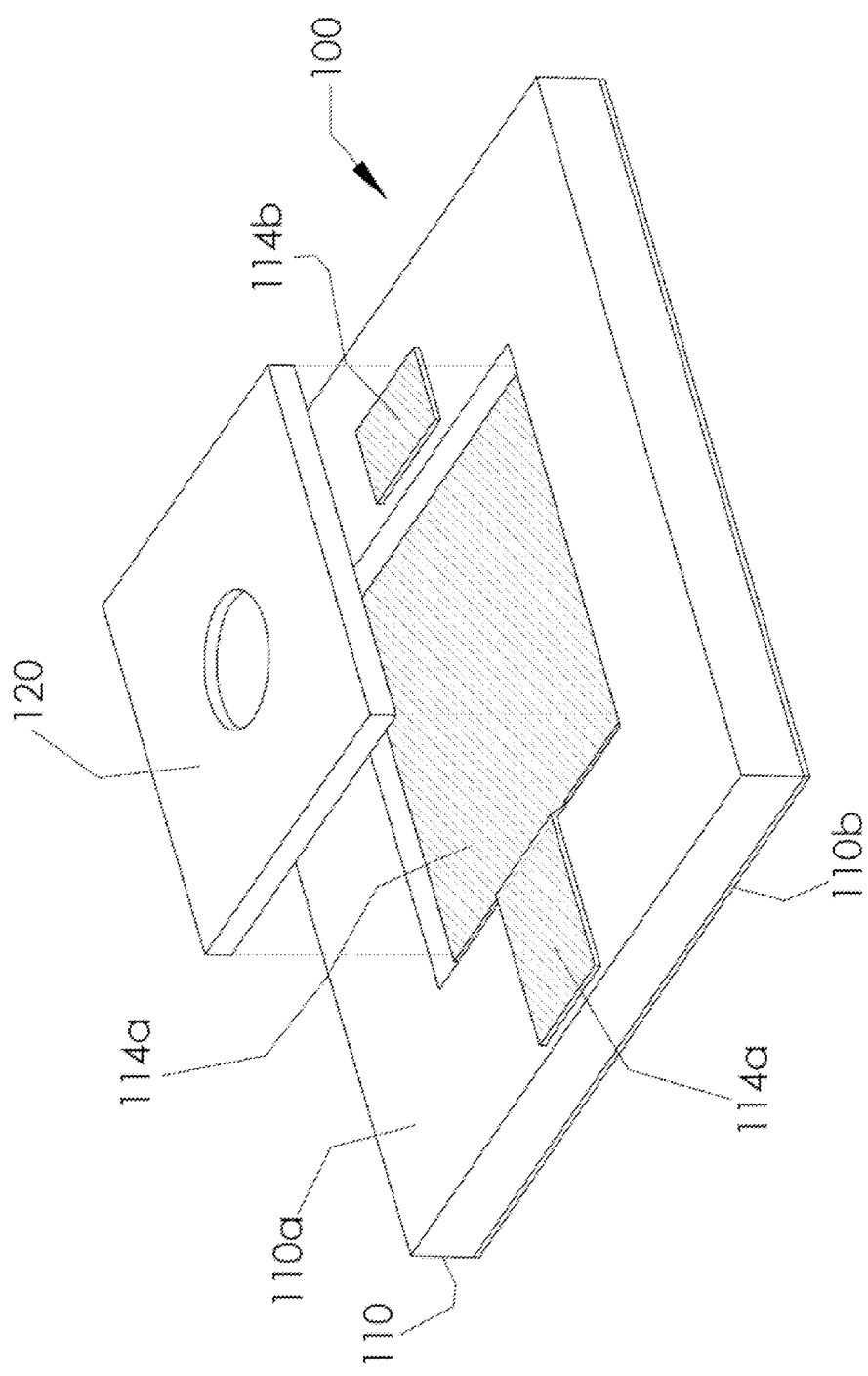
FIG. 2 illustrates an assembly view of the thermal energy transfer apparatus of FIG. 1.
Figure 3:
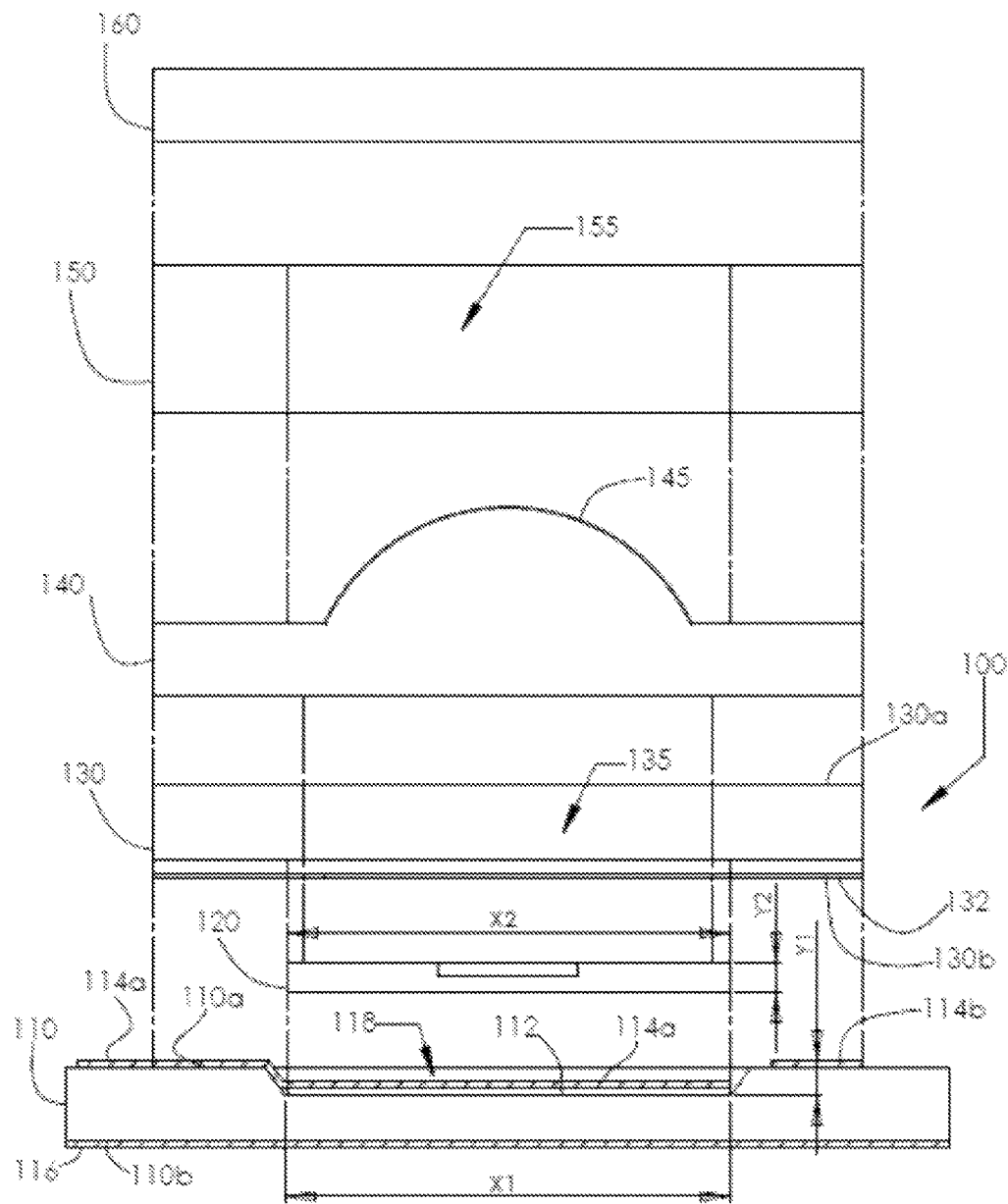
FIG. 3 illustrates an exploded side view of a thermal energy transfer apparatus for a light-emitting device in accordance with another embodiment of the present disclosure.

FIGS. 1 and 2 illustrate an embodiment of a thermal energy transfer apparatus 100 that removes thermal energy from a light-emitting device 120 when the light-emitting device 120 is bonded, attached or otherwise coupled to the thermal energy transfer apparatus 100. The thermal energy transfer apparatus 100 comprises a base plate 110 that has a first primary surface 110a and a second primary surface 110b opposite to the first primary surface 110a. The base plate 110 is non-metal, and is thermally conductive and electrically insulating such that heat may be transferred from the light-emitting device 120 to the base plate 110.

In at least one embodiment, the base plate 110 may be made of a silicon-based material. For example, the base plate 110 may be fabricated from a silicon wafer, such as a single-crystal silicon wafer. Accordingly, batch manufacturing of a plurality of base plates 110 from a single silicon wafer may be achieved using known or to-be-developed semiconductor or micro-electromechanical-system (MEMS) fabrication processes for high production volume with high yield rate. Alternatively, the base plate 110 may be made of a ceramic material such as, for example, aluminum nitride (AlN). Still alternatively, the base plate 110 may include metal-core printed circuit board (PCB), diamond, carbon-fiber, nanotubes, or thermally-conducting crystal.

The base plate 110 has a recess 118 on the first primary surface 110a. The recess 118 is dimensioned to receive the light-emitting device 120 substantially snugly such that the light-emitting device 120 cannot be moved in a direction substantially parallel to the first primary surface 110a or the second primary surface 110b when the light-emitting device 120 is received in the recess 118. That is, one or more dimensions of the recess 118 are fabricated to substantially match one or more dimensions of the light-emitting diode 120 in order to allow the light-emitting device 120 to fit snugly in the recess 118 when the light-emitting device 120 is bonded, attached or otherwise coupled to the base plate 110 to be received in the recess 118.

For illustrative purpose, assuming the light-emitting device 120 has a width dimension X2, as shown in FIG. 1, preferably the bottom of the recess 118 has a dimension X1 that is the same as or substantially the same as X2 within an acceptable range of tolerance.

Moreover, the recess 118 has a depth Y1, as shown in FIG. 1, such that the top surface of the light emitting device 120 is higher than the first primary surface 110a when the bottom surface of the light-emitting device 120, which is opposite to the top surface, is received in the recess 118. In other words, the depth Y1 of the recess 118 is at least the same as or less than the height Y2 of the light-emitting device 120.

In at least one embodiment, at least a portion of the first primary surface 110a of the base plate 110 that is not recessed (hereinafter referred to as the "non-recessed area") and at least a portion of the recess 118 may be contiguously coated with a first electrically-conductive pattern 114a that forms a first electrode, e.g., anode, for powering the light-emitting device 120. That is, the portion of the first electrically-conductive pattern 114a that is disposed on the recess 118 and the portion of the first electrically-conductive pattern 114a that is disposed on the non-recessed area of the first primary surface 110a are contiguous and hence electrically coupled together. When the light-emitting device 120 is received in the recess 118, the light-emitting device 120 contacts, and hence is electrically coupled to, the first electrically-conductive pattern 114a.

In at least one embodiment, at least a portion of the recess 118 that is covered by the light-emitting device 120 when the light-emitting device 120 is received in the recess 118 may be coated with a layer of thermally-conductive material 112. During operation, the layer of thermally-conductive material 112 aids the transfer of thermal energy, or heat, from the light-emitting device 120 to the base plate 110 by conduction to dissipate at least some of the heat generated by the light-emitting device 120. This tends to enhance the performance as well as longevity of the light-emitting device 120. In at least one embodiment, the layer of thermally-conductive material 112 may comprise diamond. In another embodiment, the layer of thermally-conductive material 112 may comprise copper, tin or silver. Alternatively, the layer of thermally-conductive material 112 may comprise carbon nanotubes.

In at least one embodiment, the non-recessed area of the first primary surface 110a of the base plate 110 and at least a portion of the layer of thermally-conductive material 112 may be contiguously coated with the first electrically-conductive pattern 114a such that the light-emitting device 120 contacts, and hence is electrically coupled to, the first electrically-conductive pattern 114a when the light-emitting device 112 is received in the recess 118 of the base plate 110.

Moreover, at least another portion of the first primary surface 110a of the base plate 110 that is not recessed and not coated with the first electrically-conductive pattern 114a is coated with a second electrically-conductive pattern 114b. The first electrically-conductive pattern 114a and the second electrically-conductive pattern 114b are electrically isolated from each other.

With the bottom of the recess 118 coated with the layer of thermally-conductive material 112 and the first electrically-conductive pattern 114a, when the depth Y1 of the recess 118 is the same as, or even slightly less than the height Y2 of the light-emitting device 120, the top surface of the light-emitting device 120 will be higher than the first primary surface 110a of the base plate 110 when the light-emitting device 120 is received in the recess 118.

In at least one embodiment, at least a portion of the second primary surface 110b is coated with a layer of metallic material 116. The layer of metallic material 116 allows the bonding of the base plate 110 to an external object, such as a heat sink which may be, for example, a substrate, a printed circuit board (PCB), a passive cooler, an active cooler, etc. In another embodiment, the second primary surface 110b is configured to allow the base plate 110 to be mounted on, bonded to, or otherwise attached to a heat sink which may be, for example, a substrate, a PCB, a passive cooler, an active cooler, etc. This would allow heat transferred from the light-emitting device 120 to the base plate 110 to be further transferred to such a heat sink for dissipation, thus further aiding heat removal from the light-emitting device 120.

Illustrative Second Thermal Energy Transfer Apparatus

FIGS. 3-6 illustrate another embodiment of the thermal energy transfer apparatus 100, which comprises one or more additional components than that shown in FIGS. 1 and 2, as described below.

In at least one embodiment, in addition to the base plate 110, the thermal energy transfer apparatus 100 may further comprise a cover element 130 that is non-metal, and is thermally conductive and electrically insulating. The cover element 130 has a second primary surface 130a and a first primary surface 130b that is opposite to the second primary surface 130a. The cover element 130 further has an opening 135 such that a portion of the top surface, e.g., a light-emitting surface, of the light-emitting device 120 is exposed and another (non-exposed) portion of the top surface of the light-emitting device 120 is in contact with the first primary surface 130b of the cover element 130 when the light-emitting device 120 is received in the recess 118 of the base plate 110 with the cover element 130 disposed on, mounted on, or otherwise bonded to, the base plate 110 to hold the light-emitting device 120 between the cover element 130 and the base plate 110.

In at least one embodiment, the cover element 130 may be made of a silicon-based material. For example, the cover element 130 may be fabricated from a silicon wafer, such as a single-crystal silicon wafer. Accordingly, batch manufacturing of a plurality of cover elements 130 from a single silicon wafer may be achieved using known or to-be-developed semiconductor or MEMS fabrication processes for high production volume with high yield rate. Alternatively, the cover element 130 may be made of a ceramic material such as, for example, aluminum nitride.

In at least one embodiment, at least a portion of the first primary surface 130b of the cover element 130 may be metalized with a metallization layer 132 (hereinafter interchangeably referred to as the "third electrically-conductive pattern"). The third electrically-conductive pattern 132, may be in contact with the light-emitting device 120 and the second electrically-conductive pattern 114b that is coated on the first primary surface 110a of the base plate 110 when the cover element 130 is disposed on, mounted on, or otherwise bonded to, the base plate 110 with the light-emitting device 120 disposed between the cover element 130 and the base plate 110. The third electrically-conductive pattern 132 and the second electrically-conductive pattern 114b form a second electrode, e.g., cathode, for powering the light-emitting device 120. The third electrically-conductive pattern 132 is electrically isolated from the first electrically-conductive pattern 114a. The cover element 130 may be configured such that at least a portion of the first electrically-conductive pattern 114a on the non-recessed area of the first primary surface 110a of the base plate 110 and at least a portion of the second electrically-conductive pattern 114b on the non-recessed area of the first primary surface 110a of the base plate 110 are exposed when the cover element 130 is disposed on, mounted on, or otherwise bonded to, the base plate 110 with the light-emitting device 120 disposed between the cover element 130 and the base plate 110. This way, each of the exposed portions of the first and second electrodes, i.e., the exposed portion of the first electrically-conductive pattern 114a and the exposed portion of the second electrically-conductive pattern 114b, may receive electrical power from respective electrical contacts to power the light-emitting device 120. This is because the top surface of the light-emitting device 120 is in contact with the third electrically-conductive pattern 132 on the cover element 130, which is in contact with the second electrically-conductive pattern 114b, while the bottom surface of the light-emitting device 120 is in contact with the first electrically-conductive pattern 114a. Such novel and non-obvious design avoids the need of wire bonding to power the light-emitting device 120, thus eliminating the complexity and costs associated with wire bonding.

Figure 4:
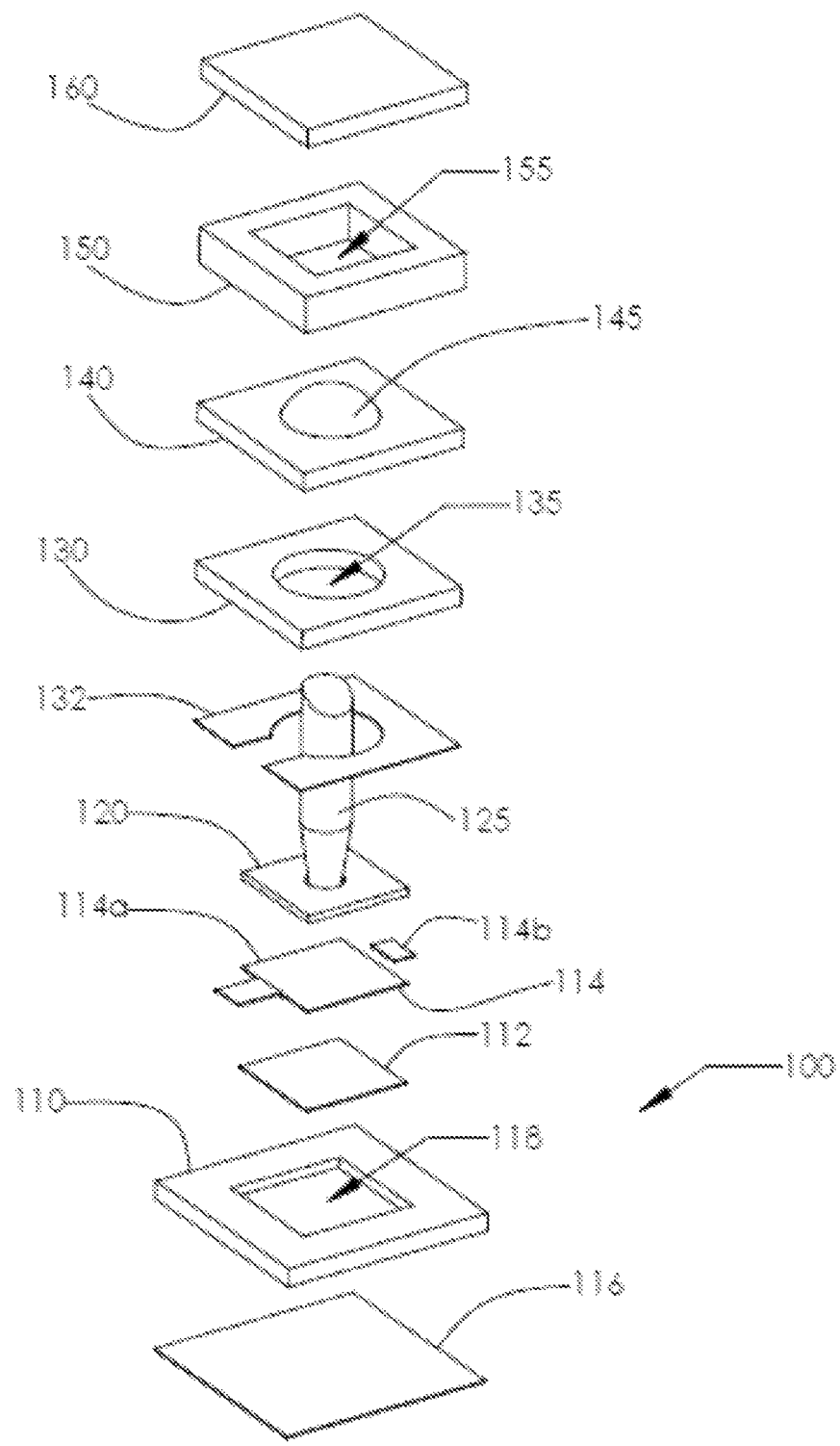
FIG. 4 illustrates an exploded perspective view of the thermal energy transfer apparatus of FIG. 3.
Figure 5:
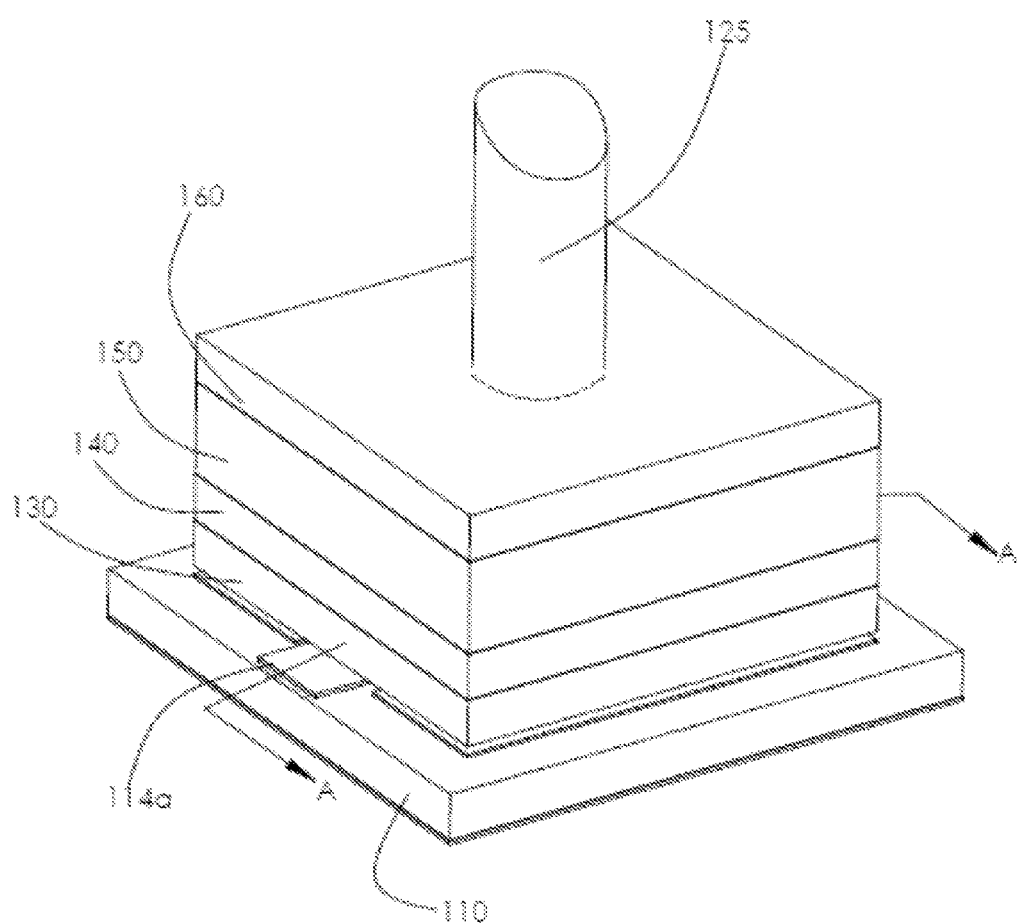
FIG. 5 illustrates a perspective view of the thermal energy transfer apparatus of FIG. 3.
Figure 6:
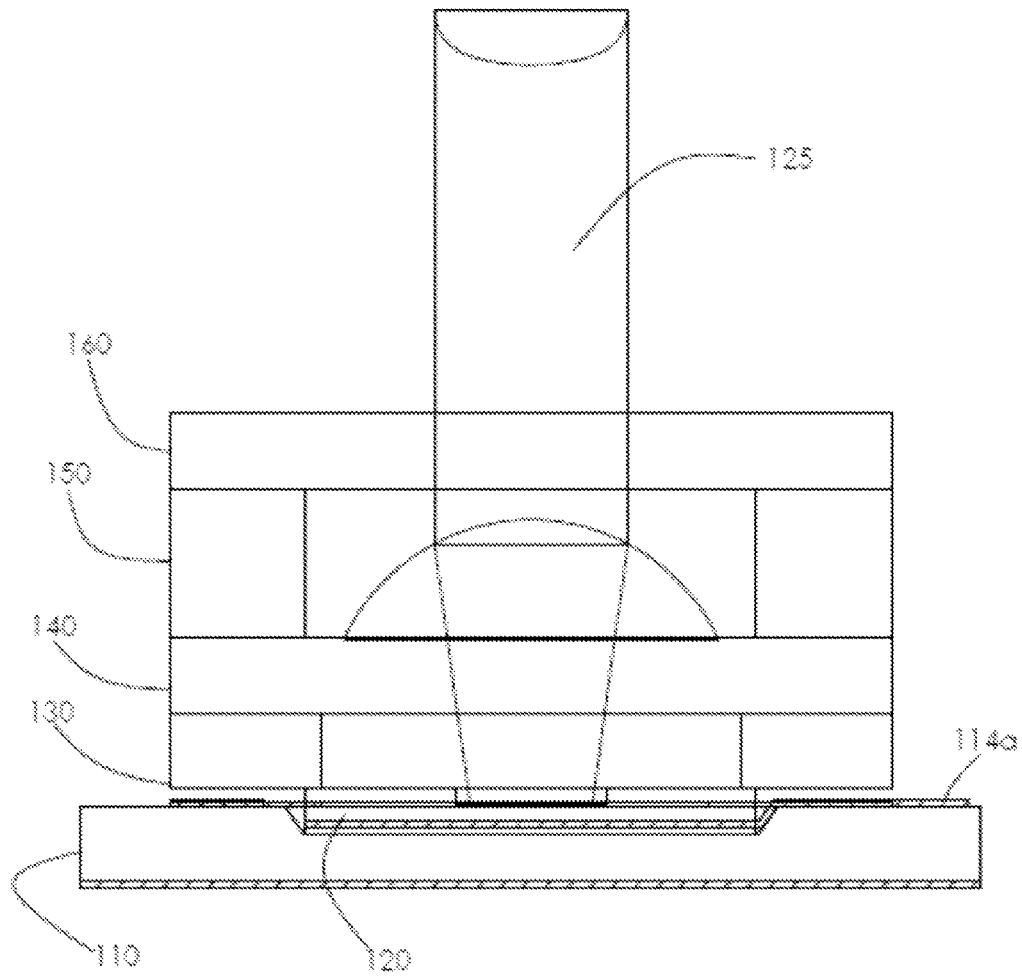
FIG. 6 illustrates a cross-sectional view of the thermal energy transfer apparatus of FIG. 5.

In at least one embodiment, the thermal energy transfer apparatus 100 may further comprise a collimating element 140 disposed on, mounted on, or otherwise bonded to, the second primary surface 130a of the cover element 130. The collimating element 140 has a lens portion 145. The lens portion 145 of the collimating element 140 collimates light 125 emitted from the light-emitting device 120 along a direction that is substantially perpendicular to the first primary surface 110a of the base plate 110 as shown in FIGS. 4-6. In at least one embodiment, the collimating element 140 is made of glass. In another embodiment, the collimating element 140 is made of polymer. Alternatively, the collimating element 140 is made of quartz.

In at least one embodiment, the thermal energy transfer apparatus 100 may further comprise a spacer element 150 disposed on, mounted on, or otherwise bonded to, the collimating element 140 such that the collimating element 140 is between the spacer element 150 and the cover element 130. The spacer element 150 has an opening 155 that accommodates at least the lens portion 145 of the collimating element 140 and allows the light 125 emitted from the light-emitting device 120 to propagate through the spacer element 150. In at least one embodiment, the spacer element 150 is made of silicon. In another embodiment, the spacer element 150 is made of ceramic.

In at least one embodiment, the thermal energy transfer apparatus 100 may further comprise a window element 160 disposed on, mounted on, or otherwise bonded to, the spacer element 150 such that the spacer element 150 is between the window element 160 and the collimating element 140. The window element 160 is substantially transparent.

In at least one embodiment, the thermal energy transfer apparatus 100 may further comprise the light-emitting device 120. The light-emitting device 120 may be, for example, a VCSEL, a LED, or another type of semiconductor-based laser or light source.

Illustrative Third Thermal Energy Transfer Apparatus

Figure 7:
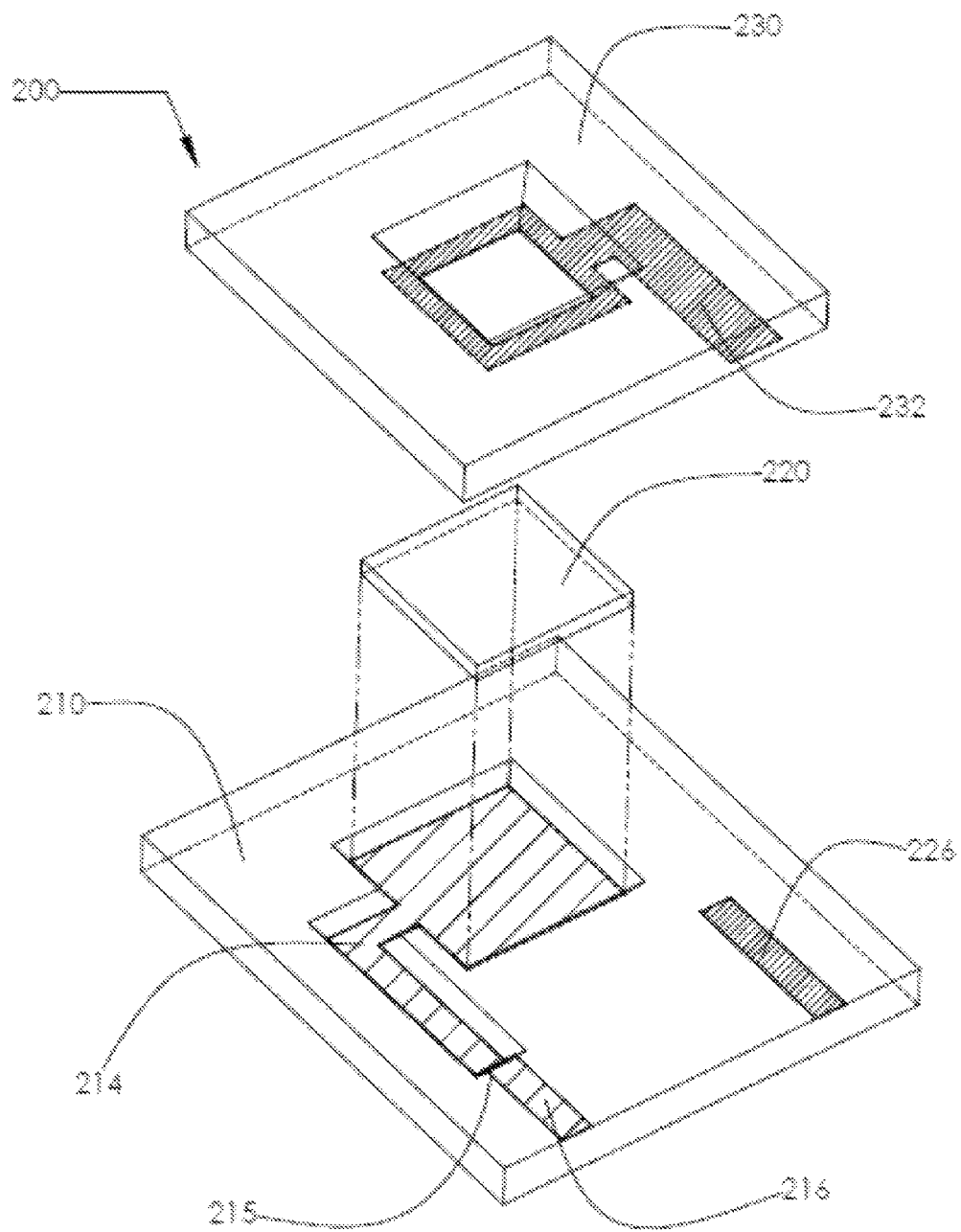
FIG. 7 illustrates an assembly view of a thermal energy transfer apparatus for a light-emitting device in accordance with another embodiment of the present disclosure.
Figure 8:
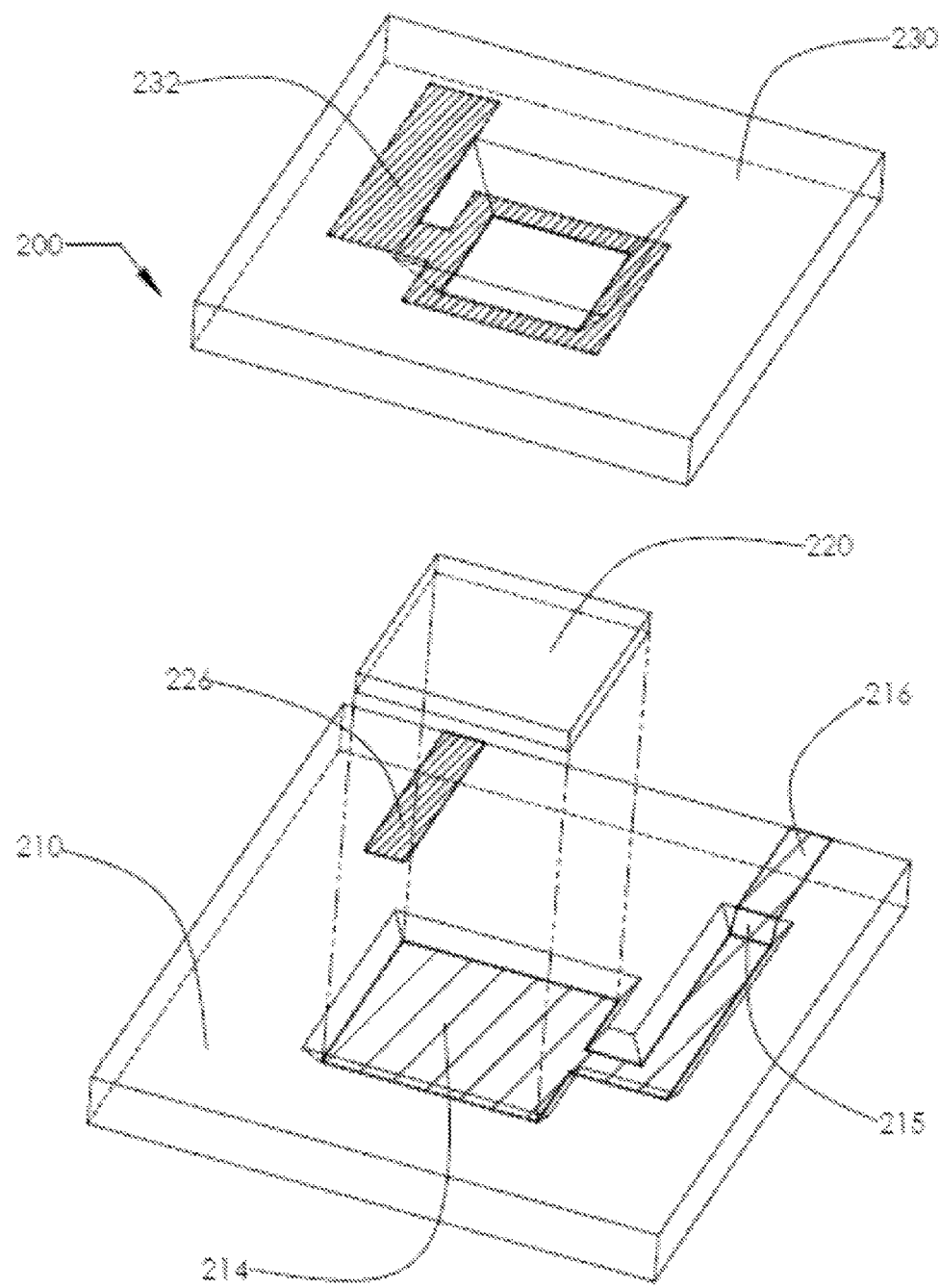
FIG. 8 illustrates another view of the thermal energy transfer apparatus of FIG. 7.
Figure 9:
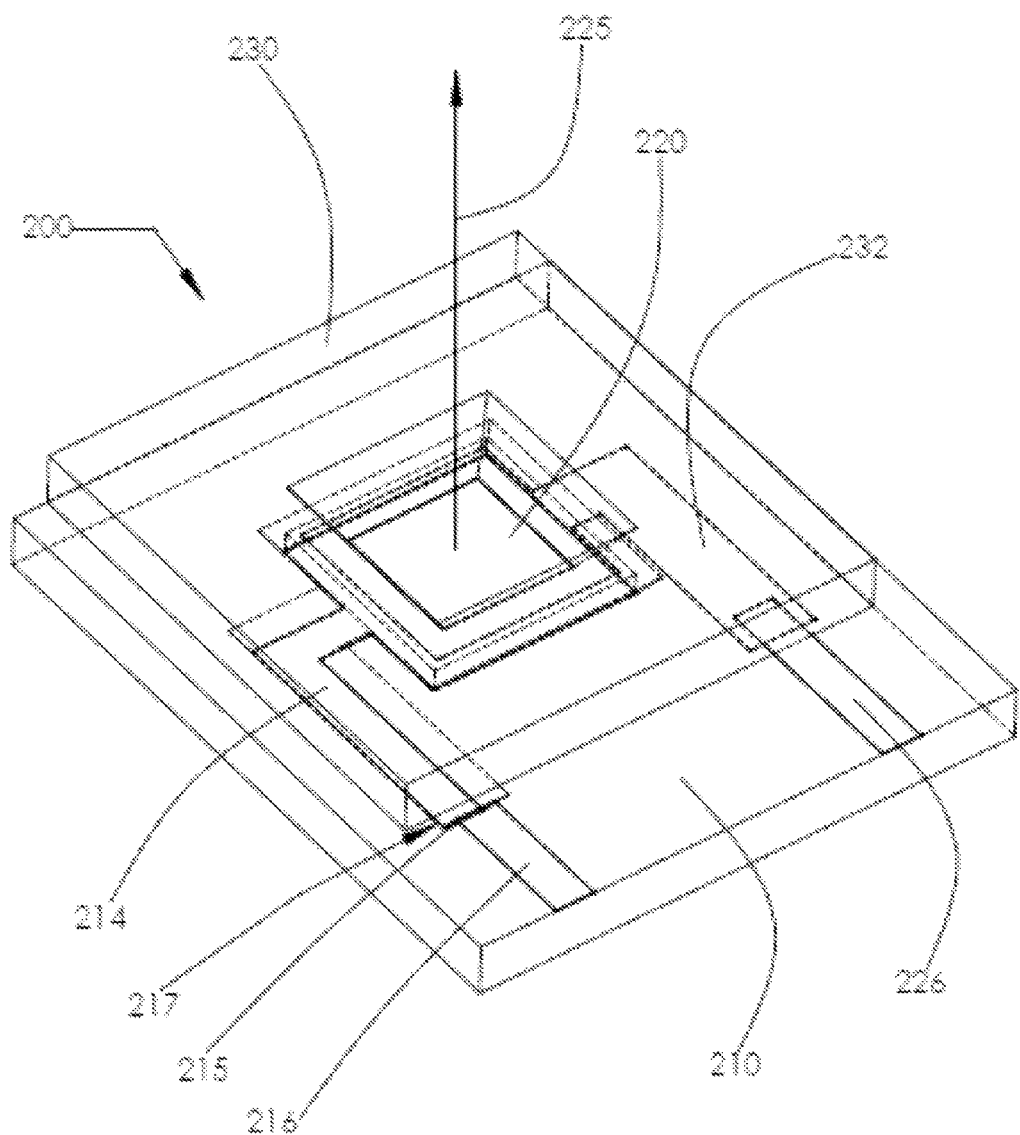
FIG. 9 illustrates a perspective view of the thermal energy transfer apparatus of FIG. 7.

FIGS. 7-9 illustrate a thermal energy transfer apparatus 200 in accordance of the present disclosure.

The apparatus 200 may comprise a base plate 210 and a cover element 230. Similar to the base plate 110, the base plate 210 is thermally conductive and electrically insulating, and may be made of a silicon-based material, e.g., single-crystal silicon, or, alternatively, a ceramic material, e.g., aluminum nitride. Alternatively, the base plate 210 may include silicon, metal-core PCB, diamond, carbon-fiber, nanotubes, or thermally-conducting crystal. Similar to the cover element 130, the cover element 230 is thermally conductive and electrically insulating, and may be made of a silicon-based material, e.g., single-crystal silicon, or, alternatively, a ceramic material, e.g., aluminum nitride. Many features and functionalities of the base plate 210 and cover element 230 are similar to those of the base plate 110 and cover element 130, respectively. Thus, in the interest of brevity, the following detailed description will be directed to features and functionalities of the base plate 210 and cover element 230 that differ from those of the base plate 110 and cover element 130.

As shown in FIGS. 7-9, the base plate 210 includes a recess that is configured to receive a light-emitting device 220 therein for the light-emitting device 220 to emit a beam of photonic energy in a direction 225. The recess includes a main portion that is dimensioned to receive the light-emitting device 220 therein snugly. The recess also includes a channel portion that is connected to the main portion. A first area of the base plate 210 is coated with a first electrically-conductive pattern that forms a first electrode, e.g., anode, for powering the light-emitting diode. In particular, the first electrically-conductive pattern includes a first portion 214 disposed in the recess, a second portion 216 disposed on the non-recessed area of the first primary surface of the base plate 210, and a third portion 215 that connects the first portion 214 and the second portion 216. In other words, the first electrically-conductive pattern is contiguously coated on, deposited on, or otherwise disposed on, the recess and the non-recessed area of the base plate 210 to form a first electrode, e.g., anode, for powering the light-emitting device 220. A second area of a non-recessed portion of the base plate 210 is coated with a second electrically-conductive pattern 226 that is electrically isolated from the first electrically-conductive pattern.

The cover element 230 is configured to be disposed on the base plate 210 to hold the light-emitting device 220 between the base plate 210 and the cover element 230 with at least a portion of a light-emitting surface of the light-emitting device 220 exposed. An area of the cover element 230 facing the base plate 210 is coated with a third electrically-conductive pattern 232 to be in contact with the second electrically-conductive pattern 226 to form a second electrode, e.g., cathode, together with the second electrically-conductive pattern 226 for powering the light-emitting device 220 when the cover element 230 is disposed on the base plate 210. The cover element 230 is not in contact with the first electrically-conductive pattern, e.g., the second portion 216, when the cover element 230 is disposed on the base plate 210. More specifically, either or both of the cover plate 230 and the channel portion of the recess on the base plate 210 may be dimensioned such that there exists a gap 217 between the cover element 230 and the second portion 216 of the first electrically-conductive pattern. This feature ensures that there is no contact between the third electrically-conductive pattern 232 and the second portion 216 of the first electrically-conductive pattern that would result in a short circuit.

In at least one embodiment, the thermal energy transfer apparatus 200 may further comprise a collimating element 140 as described above with respect to the apparatus 100.

In at least one embodiment, the thermal energy transfer apparatus 200 may further comprise a spacer element 150 as described above with respect to the apparatus 100.

In at least one embodiment, the thermal energy transfer apparatus 200 may further comprise a window element 160 as described above with respect to the apparatus 100.

In at least one embodiment, the thermal energy transfer apparatus 200 may further comprise the light-emitting device 220. The light-emitting device 220 may be, for example, a VCSEL, a LED, or another type of semiconductor-based laser or light source.

Illustrative Fourth Thermal Energy Transfer Apparatus

Figure 10:
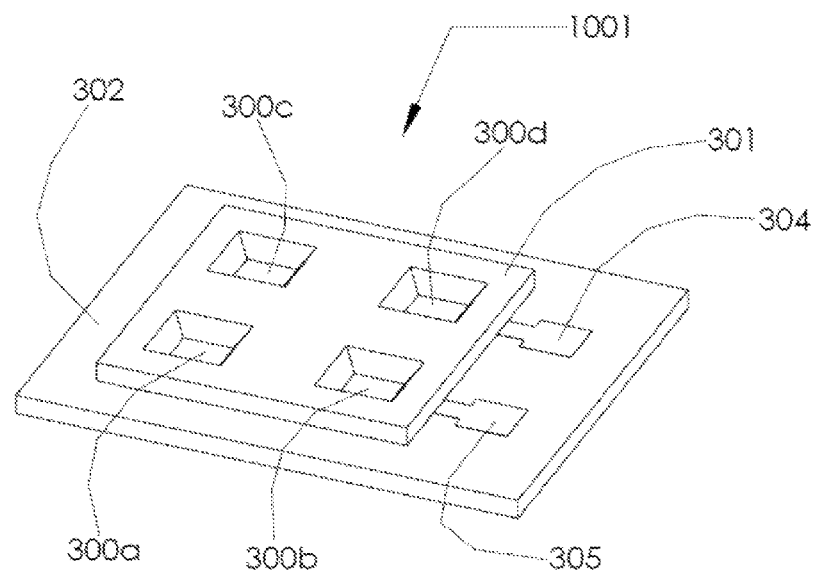
FIG. 10 illustrates a perspective view of a thermal energy transfer apparatus for one or more light-emitting devices in accordance with yet another embodiment of the present disclosure.
Figure 11:
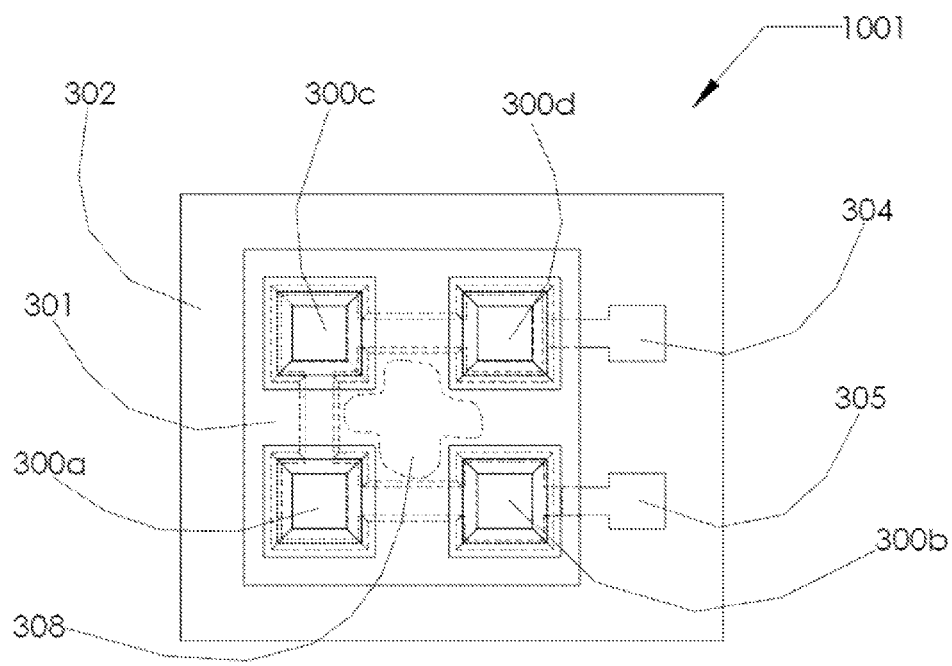
FIG. 11 illustrates a top view of the thermal energy transfer apparatus of FIG. 10.
Figure 12:
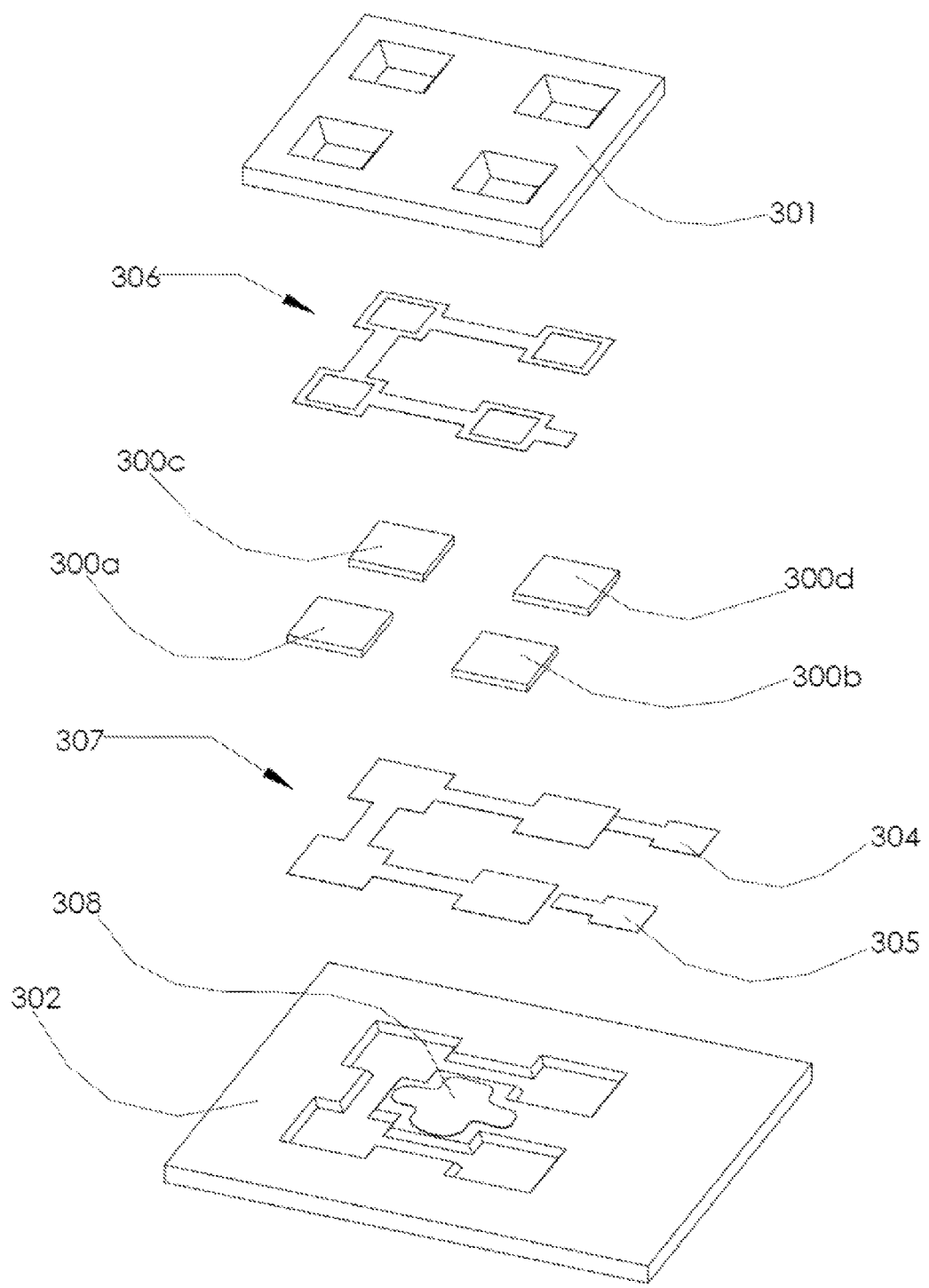
FIG. 12 illustrates an exploded view of the thermal energy transfer apparatus of FIG. 10.

FIGS. 10-12 illustrate a thermal energy transfer apparatus 1001 for one or more light-emitting devices in accordance with yet another embodiment of the present disclosure.

As shown in FIGS. 10-12, apparatus 1001 includes a base plate 302 and a cove element 301, both of which are non-metal. In some embodiments, base plate 302 may be silicon-based and made of single-crystal silicon. Alternatively, base plate 302 may be made of ceramic or another suitable non-metal material. For example, base plate 302 may include metal-core PCB, diamond, carbon-fiber, nanotubes, or thermally-conducting crystal. In some embodiments, cover element 301 may be silicon-based and made of single-crystal silicon. Alternatively, cover element 301 may be made of ceramic or another suitable non-metal material. While similar to apparatus 100 and apparatus 200 in certain aspects, apparatus 1001 is scaled up to accommodate one or more light-emitting devices. In the illustrated example, apparatus 1001 is configured to accommodate four light-emitting devices 300a, 300b, 300c and 300d.

The base plate 302 may include a recess configured to receive one or more light-emitting devices therein. As shown in FIGS. 10-12, the recess is configured to receive the light-emitting devices 300a, 300b, 300c and 300d. A first area of the base plate 302 may be coated with a first electrically-conductive pattern 304 that forms a first electrode 307, e.g., anode electrode, for powering the one or more light-emitting devices. A second area of the base plate 302 may be coated with a second electrically-conductive pattern 305 that is electrically isolated from the first electrically-conductive pattern 304. The cover element 301 may be configured to be disposed on the base plate 302 to hold the one or more light-emitting devices (e.g., light-emitting devices 300a, 300b, 300c and 300d) between the base plate 302 and the cover element 301 with at least a portion of a light-emitting surface of each of the one or more light-emitting devices exposed (e.g., the upward-facing surface of light-emitting devices 300a, 300b, 300c and 300d as shown in FIGS. 10-12). An area of the cover element 302 may be coated with a third electrically-conductive pattern 306 that is in contact with the second electrically-conductive 305 pattern to form a second electrode, e.g., cathode electrode, together with the second electrically-conductive pattern 305 for powering the one or more light-emitting devices when the cover element 302 is disposed on the base plate 301.

One side (e.g., the upward-facing side as shown in FIGS. 10-12) of each of the light-emitting devices 300a, 300b, 300c and 300d is electrically connected by the second electrode (formed by the second electrically-conductive pattern 305 and the third electrically-conductive pattern 306)

while the opposite side (e.g., the downward-facing side as shown in FIGS. 10-12) of each of the light-emitting devices 300a, 300b, 300c and 300d is electrically connected to the first electrode 307 (formed by the second-electrically-conductive pattern 304). The first electrode 307 and the second electrode are electrically isolated from each other.

In some embodiments, the cover element 301 may have a first primary surface (e.g., the downward-facing surface as shown in FIGS. 10-12) and a second primary surface (e.g., the upward-facing surface as shown in FIGS. 10-12) opposite the first primary surface thereof with the first primary surface of the cover element 301 facing the base plate 302 and the one or more light-emitting devices. The second primary surface of the cover element 301 may include a plurality of grooves.

In some embodiments, the base plate 302 may include a first primary surface (e.g., the upward-facing surface as shown in FIGS. 10-12) and a second primary surface (e.g., the downward-facing surface as shown in FIGS. 10-12) opposite to the first primary surface. The first primary surface of the base plate 302 may include a non-recessed area and the recess. The recess is configured to receive the one or more light-emitting devices therein. At least a portion of the recess and a first portion of the non-recessed area of the base plate 302 are contiguously coated with the first electrically-conductive pattern 304. A second portion of the non-recessed area of the base plate 302 is coated with the second electrically-conductive pattern 305. The cover element 301 may include a first primary surface (e.g., the downward-facing surface as shown in FIGS. 10-12) and a second primary surface (e.g., the upward-facing surface as shown in FIGS. 10-12) opposite to the first primary surface. The first primary surface of the cover element 301 may be coated with the third electrically-conductive pattern 306 that is configured to be in contact with the second electrically-conductive pattern 305 when the cover element 301 is disposed on the base plate 302 with the first primary surface of the cover element 301 facing the first primary surface of the base plate 302.

In some embodiments, the recess may include a main portion and a channel portion with the main portion dimensioned to receive the one or more light-emitting devices therein. A first part of the first electrically-conductive pattern 304 may be disposed in the main portion and the channel portion of the recess. A second part of the first electrically-conductive pattern 304 that is contiguous with the first part of the first electrically-conductive pattern 304 may be disposed on the first portion of the non-recessed area of the first primary surface of the base plate 302. The cover element 301 may be configured to be not in contact with the second part of the first electrically-conductive pattern 304 when the cover element 301 is disposed on the base plate 302.

In some embodiments, apparatus 1001 may further include a layer of thermally-conductive material 308 disposed on a non-recessed area of the base plate 302 and configured to be in contact with the cover element 301 when the cover element 301 is disposed on the base plate 302 such that the layer of thermally-conductive material 308 functions as a thermal path to transfer thermal energy between the cover element 301 and the base plate 302. For example, the layer of thermally-conductive material 308 may be a metal pad and allows flowing of heat between the cover element 301 and the base plate 302 after absorbing the heat from light-emitting devices 300a, 300b, 300c and 300d.

In some embodiments, the layer of thermally-conductive material 308 may include diamond, copper, tin, silver or carbon nanotubes.

In some embodiments, apparatus 1001 may further include a layer of metallic material (not shown) disposed on at least a portion of the second primary surface of the base plate 302, similar to the layer of metallic material 116 of apparatus 100. The metallic material may bond the base plate 302 to an external object.

In some embodiments, apparatus 1001 may further include a collimating element (not shown) disposed on the cover element 301, similar to the collimating element 140 of apparatus 100 and apparatus 200. The collimating element may include a lens portion that collimates light emitted from the one or more light-emitting devices along a predefined direction.

In some embodiments, the collimating element may be made of glass, polymer, or quartz.

In some embodiments, apparatus 1001 may further include a spacer element (not shown) disposed on the collimating element with the collimating element disposed between the spacer element and the cover element 301, similar to the collimating element 140 of apparatus 100 and apparatus 200. The spacer element may include an opening that accommodates at least the lens portion of the collimating element and may allow the light emitted from the one or more light-emitting devices to propagate through the spacer element.

In some embodiments, the spacer element may be made of silicon or ceramic.

In some embodiments, apparatus 1001 may further include a window element (not shown) disposed on the spacer element with the spacer element disposed between the window element and the collimating element, similar to the window element 160 of apparatus 100 and apparatus 200. The window element may be substantially transparent.

In some embodiments, apparatus 1001 may further include the one or more light-emitting devices, e.g., the light-emitting devices 300a, 300b, 300c and 300d, received in the recess of the base plate 302. The one or more light-emitting devices may be disposed between the base plate 302 and the cover element 301 and configured to receive electrical power from the first electrode 307 and the second electrode to emit light. The one or more light-emitting devices may include one or more vertical-cavity surface-emitting laser (VCSEL) or one or more light-emitting diodes (LED).

It is noteworthy that, although the example apparatus 1001 shown in FIGS. 10-12 has the recess on the base plate 302, in alternative embodiments, it is the cover element 301 that has a recess configured to receive the one or more light-emitting devices therein. The recess, whether a feature on the base plate 302 or a feature on the cover element 301, allows passive alignment of the one or more light-emitting devices in a mass production setting in which light-emitting devices such as light-emitting devices 300a, 300b, 300c and 300d may simply be placed in the recess to be aligned with respect the entire package of apparatus 1001.

Illustrative Fifth Thermal Energy Transfer Apparatus

Figure 13:
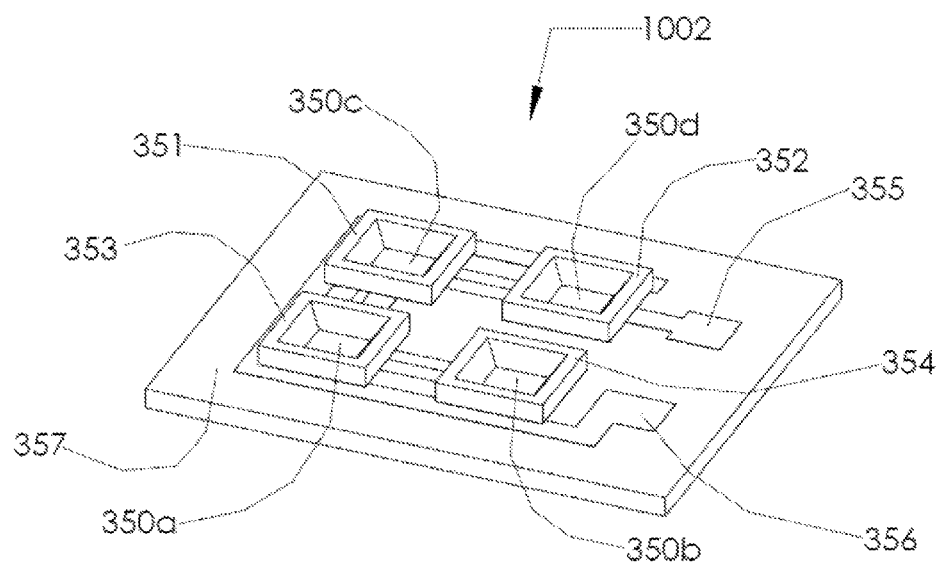
FIG. 13 illustrates a perspective view of a thermal energy transfer apparatus for one or more light-emitting devices in accordance with still another embodiment of the present disclosure.
Figure 14:
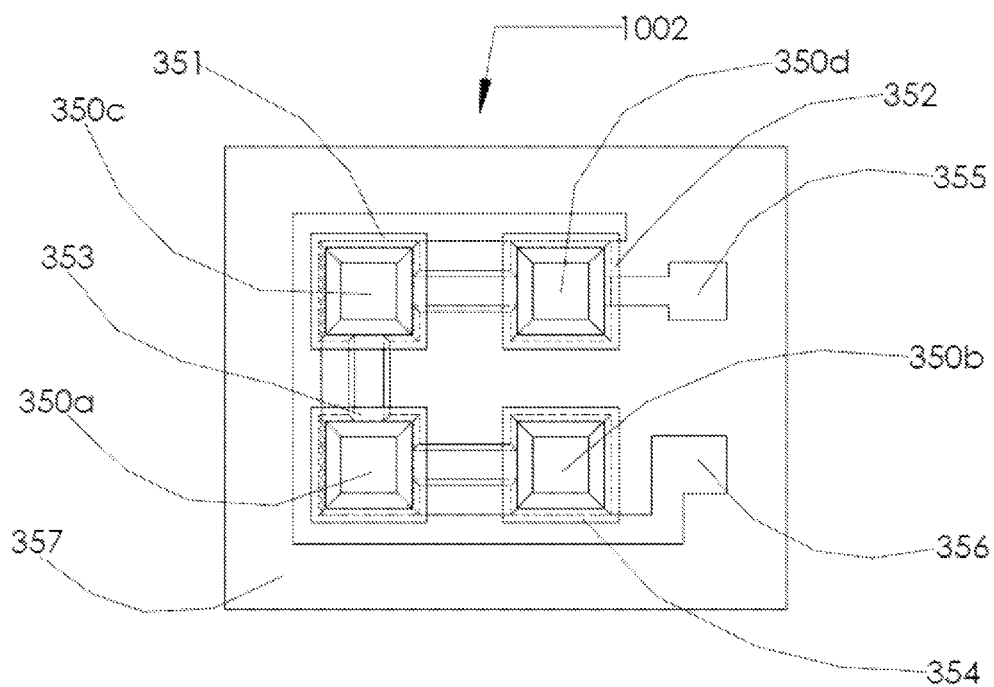
FIG. 14 illustrates a top view of the thermal energy transfer apparatus of FIG. 13.
Figure 15:
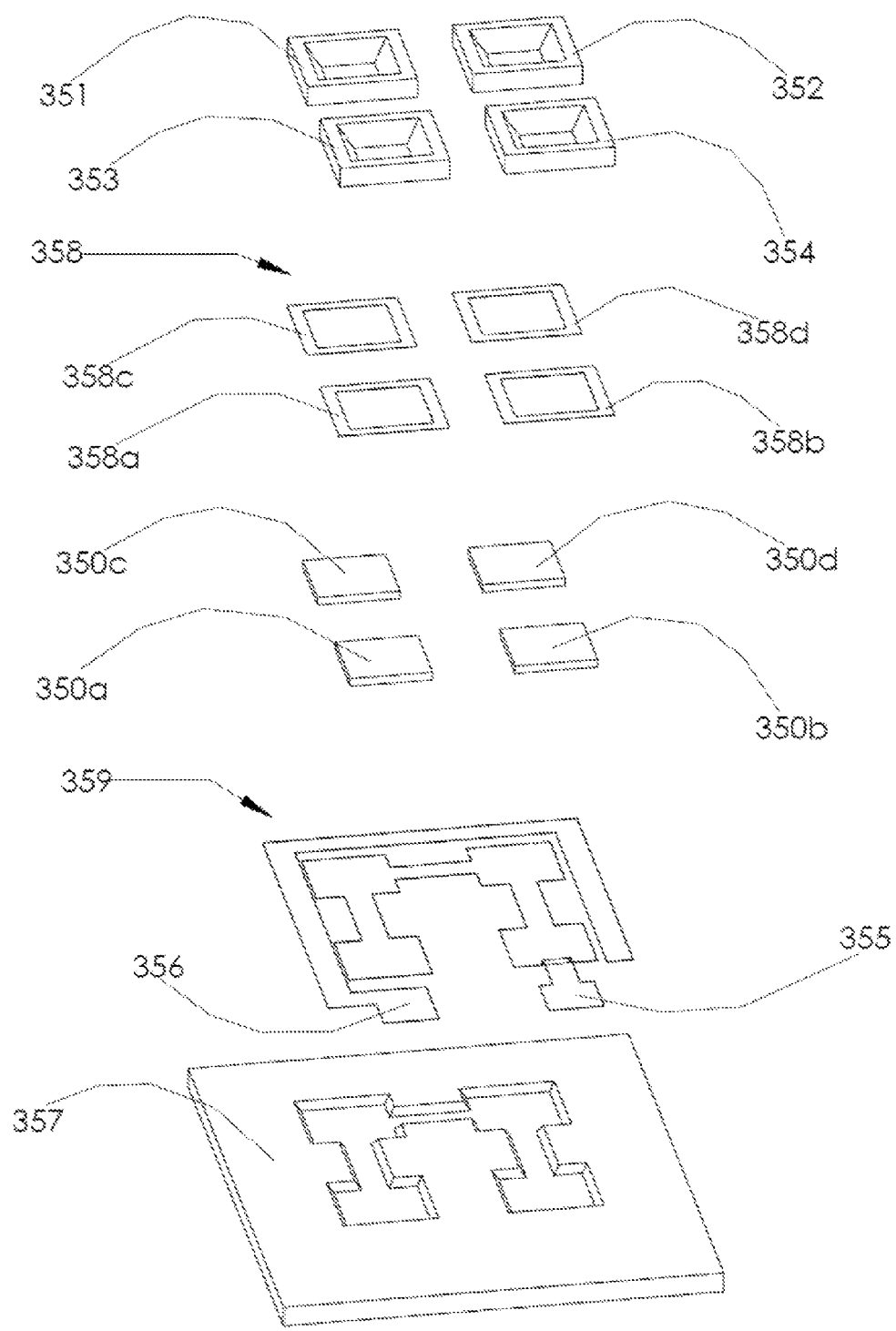
FIG. 15 illustrates an exploded view of the thermal energy transfer apparatus of FIG. 13.

FIGS. 13-15 illustrate a thermal energy transfer apparatus 1002 for one or more light-emitting devices in accordance with still another embodiment of the present disclosure. Certain features of apparatus 1002 are similar to corresponding features of apparatus 1001 while certain other features of apparatus 1002 differ from respective features of apparatus 1001. Thus, in the interest of brevity, the detailed description of apparatus 1002 below is focused on the differences between apparatus 1002 and apparatus 1001.

Apparatus 1002 includes a base plate 357, which is non-metal. In some embodiments, base plate 357 may be silicon-based and made of single-crystal silicon. Alternatively, base plate 357 may be made of ceramic or another suitable non-metal material. For example, base plate 357 may include metal-core PCB, diamond, carbon-fiber, nanotubes, or thermally-conducting crystal. As shown in FIGS. 13-15, rather than a single piece of cover element, apparatus 1002 comprises multiple cover elements 351, 352, 353 and 354. The cover elements 351, 352, 353 and 354 may be non-metal. In some embodiments, at least one of the cover elements 351, 352, 353 and 354 may be silicon-based and made of single-crystal silicon. Alternatively, at least one of the cover elements 351, 352, 353 and 354 may be made of ceramic or another suitable non-metal material.

The base plate 357 may include a recess configured to receive one or more light-emitting devices therein. As shown in FIGS. 13-15, the recess is configured to receive the light-emitting devices 350a, 350b, 350c and 350d. A first area of the base plate 357 may be coated with a first electrically-conductive pattern 355 that forms a first electrode 359, e.g., anode electrode, for powering the one or more light-emitting devices. A second area of the base plate 357 may be coated with a second electrically-conductive pattern 356 that is electrically isolated from the first electrically-conductive pattern 355. Each of the cover elements 351, 352, 353 and 354 may be configured to be disposed on the base plate 357 to hold the one or more light-emitting devices (e.g., light-emitting devices 350a, 350b, 350c and 350d) between the base plate 357 and the cover elements 351, 352, 353 and 354 with at least a portion of a light-emitting surface of each of the one or more light-emitting devices exposed (e.g., the upward-facing surface of light-emitting devices 350a, 350b, 350c and 350d as shown in FIGS. 13-15). An area of each of the cover elements 351, 352, 353 and 354 may be coated with a third electrically-conductive pattern 358a, 358b, 358c and 358d, respectively, which is in contact with the second electrically-conductive 356 pattern to form a second electrode, e.g., cathode electrode, together with the second electrically-conductive pattern 356 for powering the one or more light-emitting devices when the cover elements 351, 352, 353 and 354 are disposed on the base plate 357.

One side (e.g., the upward-facing side as shown in FIGS. 13-15) of each of the light-emitting devices 350a, 350b, 350c and 350d is electrically connected by the second electrode (formed by the second electrically-conductive pattern 356 and the third electrically-conductive pattern 358a, 358b, 358c and 358d) while the opposite side (e.g., the downward-facing side as shown in FIGS. 13-15) of each of the light-emitting devices 350a, 350b, 350c and 350d is electrically connected to the first electrode 359 (formed by the second-electrically conductive pattern 355). The first electrode 359 and the second electrode are electrically isolated from each other.

In some embodiments, each of the cover elements 351, 352, 353 and 354 may have a first primary surface (e.g., the downward-facing surface as shown in FIGS. 13-15) and a second primary surface (e.g., the upward-facing surface as shown in FIGS. 13-15) opposite the first primary surface thereof with the first primary surface of each of the cover elements 351, 352, 353 and 354 facing the base plate 357 and the one or more light-emitting devices. The second primary surface of each of the cover elements 351, 352, 353 and 354 may include a plurality of grooves.

In some embodiments, the base plate 357 may include a first primary surface (e.g., the upward-facing surface as shown in FIGS. 13-15) and a second primary surface (e.g., the downward-facing surface as shown in FIGS. 13-15) opposite to the first primary surface. The first primary surface of the base plate 357 may include a non-recessed area and the recess. The recess is configured to receive the one or more light-emitting devices therein. At least a portion of the recess and a first portion of the non-recessed area of the base plate 357 are contiguously coated with the first electrically-conductive pattern 355. A second portion of the non-recessed area of the base plate 357 is coated with the second electrically-conductive pattern 356. The first primary surface of each of the cover elements 351, 352, 353 and 354 may be coated with the third electrically-conductive pattern 358a, 358b, 358c and 358d that is configured to be in contact with the second electrically-conductive pattern 356 when any of the cover elements 351, 352, 353 and 354 is disposed on the base plate 357 with the first primary surface of the respective cover element facing the first primary surface of the base plate 357.

In some embodiments, the recess may include a main portion and a channel portion with the main portion dimensioned to receive the one or more light-emitting devices therein. A first part of the first electrically-conductive pattern 355 may be disposed in the main portion and the channel portion of the recess. A second part of the first electrically-conductive pattern 355 that is contiguous with the first part of the first electrically-conductive pattern 355 may be disposed on the first portion of the non-recessed area of the first primary surface of the base plate 357. At least one of the cover elements 351, 352, 353 and 354 may be configured to be not in contact with the second part of the first electrically-conductive pattern 355 when the respective cover element is disposed on the base plate 357.

In some embodiments, apparatus 1002 may further include the one or more light-emitting devices, e.g., the light-emitting devices 350a, 350b, 350c and 350d, received in the recess of the base plate 357. The one or more light-emitting devices may be disposed between the base plate 357 and the cover elements 351, 352, 353 and 354, and receive electrical power from the first electrode 359 and the second electrode to emit light. The one or more light-emitting devices may include one or more VCSEL or one or more LED.

Thus, in apparatus 1002, the cover elements 351, 352, 353 and 354 are electrically connected with the first electrode 359 for supplying power to light-emitting devices 350a, 350b, 350c and 350d. The second electrode may bond the light-emitting devices 350a, 350b, 350c and 350d to the base plate 357 by metal solder.

Illustrative Sixth Thermal Energy Transfer Apparatus

FIGS. 16-20 illustrate a thermal energy transfer apparatus 1003 for one or more light-emitting devices in accordance with yet another embodiment of the present disclosure.

Figure 16:
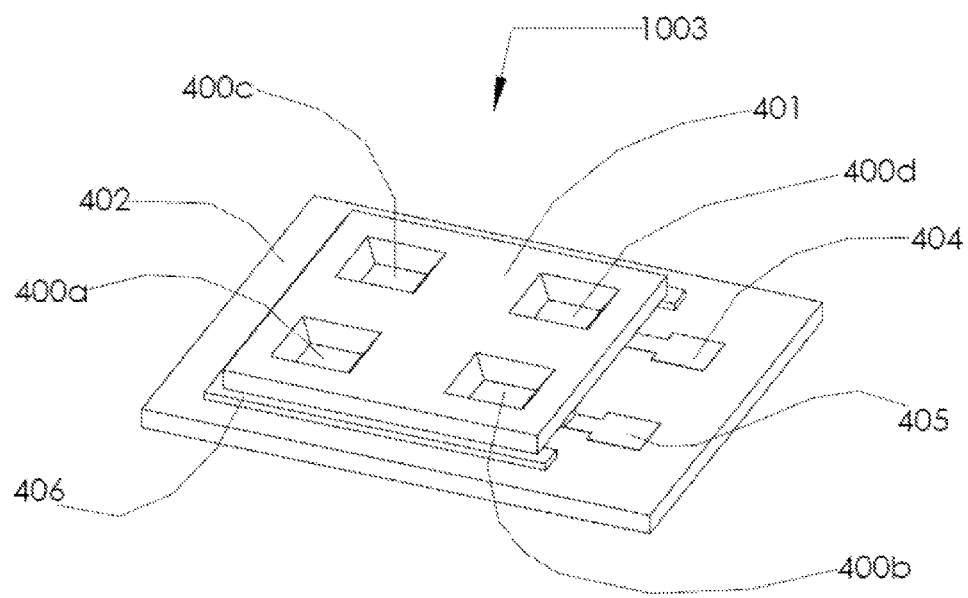
FIG. 16 illustrates a perspective view of a thermal energy transfer apparatus for one or more light-emitting devices in accordance with yet another embodiment of the present disclosure.
Figure 17:
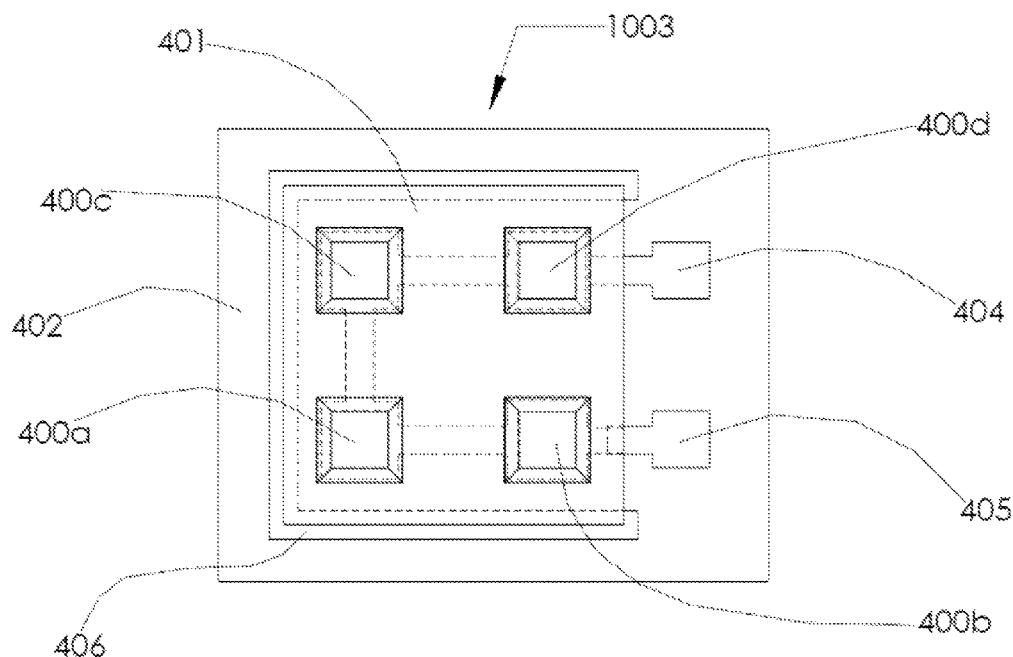
FIG. 17 illustrates a top view of the thermal energy transfer apparatus of FIG. 16.
Figure 18:
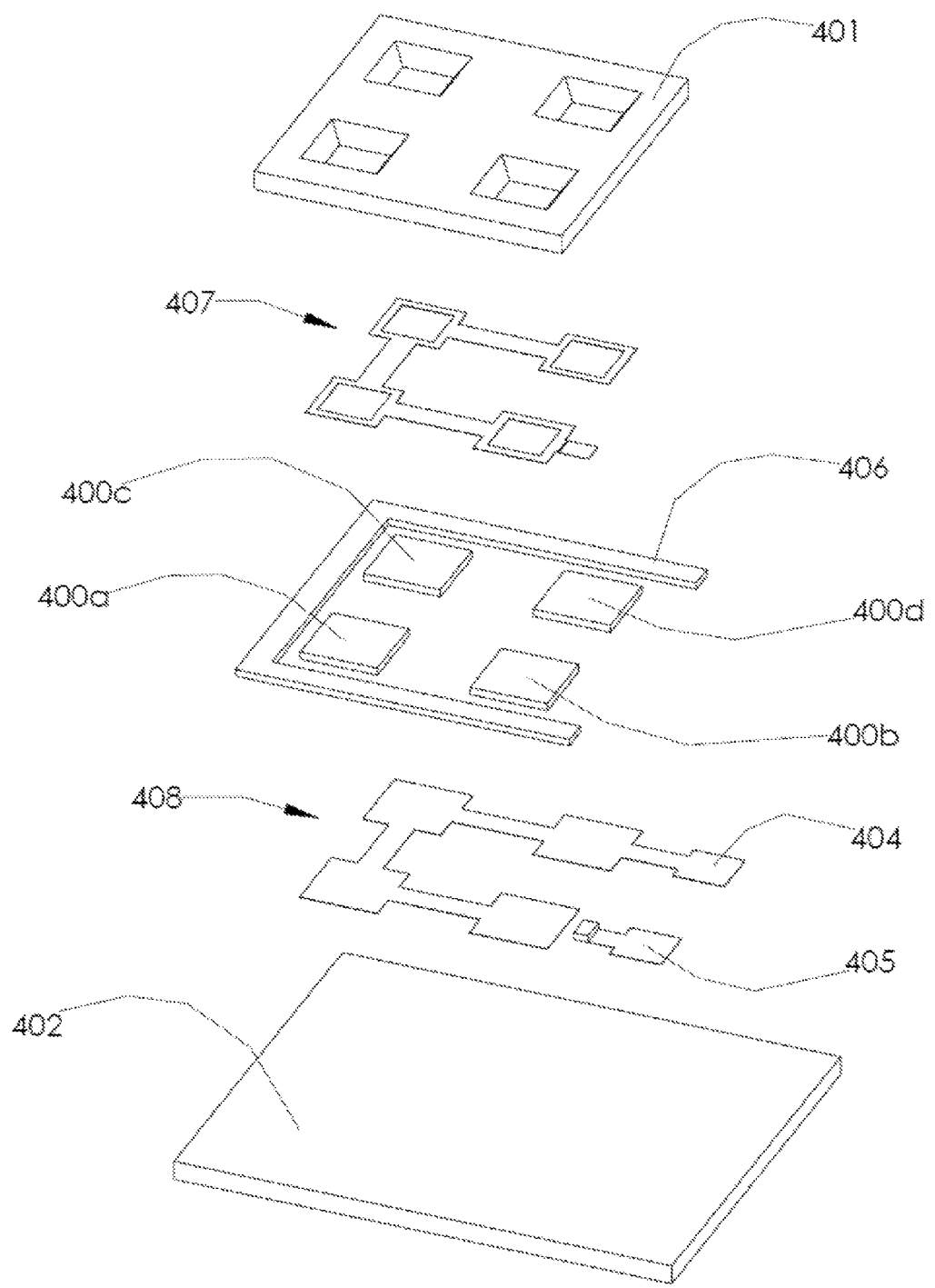
FIG. 18 illustrates an exploded view of the thermal energy transfer apparatus of FIG. 16.

As shown in FIGS. 16-18, apparatus 1003 includes a base plate 402 and a cove element 401, both of which are non-metal. In some embodiments, base plate 402 may be silicon-based and made of single-crystal silicon. Alternatively, base plate 402 may be made of ceramic or another suitable non-metal material. For example, base plate 402 may include metal-core PCB, diamond, carbon-fiber, nanotubes, or thermally-conducting crystal. In some embodiments, cover element 401 may be silicon-based and made of single-crystal silicon. Alternatively, cover element 401 may be made of ceramic or another suitable non-metal material. While similar to apparatus 100 and apparatus 200 in certain aspects, apparatus 1003 is scaled up to accommodate one or more light-emitting devices. In the illustrated example, apparatus 1003 is configured to accommodate four light-emitting devices 400a, 400b, 400c and 400d.

Figure 19:
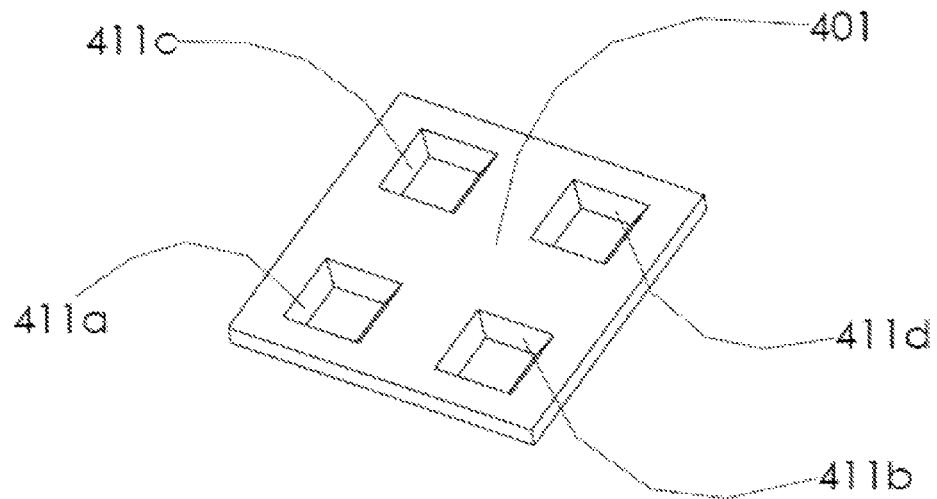
FIG. 19 illustrates a perspective view of one side of a cover element of the thermal energy transfer apparatus of FIG. 16.
Figure 20:
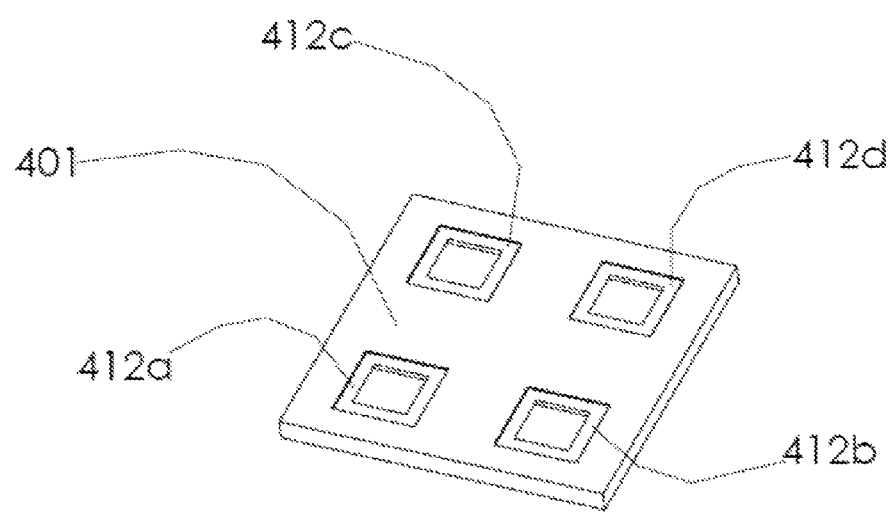
FIG. 20 illustrates a perspective view of another side of a cover element of the thermal energy transfer apparatus of FIG. 16.

As shown in FIGS. 19 and 20, the cover element 401 may include a recess 412a, 412b, 412c and 412d each of which configured to receive a respective light-emitting devices therein. The cover element 401 may also include one or more openings 411a, 411b, 411c and 411d to expose at least a portion of a light-emitting surface of the light-emitting devices 400a, 400b, 400c and 400d when the light-emitting devices 400a, 400b, 400c and 400d are disposed between the cover element 401 and the base plate 402. The one or more light-emitting devices and the cover element 401 may be disposed on the base plate 402 with the one or more light-emitting devices sandwiched between the cover element 401 and the base plate 402.

A first area of the base plate 402 may be coated with a first electrically-conductive pattern 404 that forms a first electrode 408, e.g., anode electrode, for powering the one or more light-emitting devices. A second area of the base plate 402 may be coated with a second electrically-conductive pattern 405 that is electrically isolated from the first electrically-conductive pattern 404. The cover element 401 may be configured to be disposed on the base plate 402 to hold the one or more light-emitting devices (e.g., light-emitting devices 400a, 400b, 400c and 400d) between the base plate 402 and the cover element 401 with at least a portion of a light-emitting surface of each of the one or more light-emitting devices exposed (e.g., the upward-facing surface of light-emitting devices 400a, 400b, 400c and 400d as shown in FIGS. 16-18). An area of the cover element 402 may be coated with a third electrically-conductive pattern 407 that is in contact with the second electrically-conductive 405 pattern to form a second electrode, e.g., cathode electrode, together with the second electrically-conductive pattern 405 for powering the one or more light-emitting devices when the cover element 402 is disposed on the base plate 401.

One side (e.g., the upward-facing side as shown in FIGS. 16-18) of each of the light-emitting devices 400a, 400b, 400c and 400d is electrically connected by the second electrode (formed by the second electrically-conductive pattern 405 and the third electrically-conductive pattern 407) while the opposite side (e.g., the downward-facing side as shown in FIGS. 16-18) of each of the light-emitting devices 400a, 400b, 400c and 400d is electrically connected to the first electrode 408 (formed by the second-electrically conductive pattern 404). The first electrode 408 and the second electrode are electrically isolated from each other.

In some embodiments, the cover element 401 may have a first primary surface (e.g., the downward-facing surface as shown in FIGS. 16-18) and a second primary surface (e.g., the upward-facing surface as shown in FIGS. 16-18) opposite the first primary surface thereof with the first primary surface of the cover element 401 facing the base plate 402 and the one or more light-emitting devices. The second primary surface of the cover element 401 may include a plurality of grooves.

In some embodiments, apparatus 1003 may further include a shim element 406 disposed between the base plate 402 and the cover element 401 to accommodate the thickness or height of the one or more light-emitting devices. For example, a thickness or height of the shim element 406 plus a depth of the recess in the cover element 401 may be approximately equal to the thickness or height of the one or more light-emitting devices.

In some embodiments, apparatus 1003 may further include a layer of metallic material (not shown) disposed on at least a portion of the second primary surface of the base plate 402, similar to the layer of metallic material 116 of apparatus 100. The metallic material may bond the base plate 402 to an external object.

In some embodiments, apparatus 1003 may further include a collimating element (not shown) disposed on the cover element 401, similar to the collimating element 140 of apparatus 100 and apparatus 200. The collimating element may include a lens portion that collimates light emitted from the one or more light-emitting devices along a predefined direction.

In some embodiments, the collimating element may be made of glass, polymer, or quartz.

In some embodiments, apparatus 1003 may further include a spacer element (not shown) disposed on the collimating element with the collimating element disposed between the spacer element and the cover element 401, similar to the collimating element 140 of apparatus 100 and apparatus 200. The spacer element may include an opening that accommodates at least the lens portion of the collimating element and may allow the light emitted from the one or more light-emitting devices to propagate through the spacer element.

In some embodiments, the spacer element may be made of silicon or ceramic.

In some embodiments, apparatus 1003 may further include a window element (not shown) disposed on the spacer element with the spacer element disposed between the window element and the collimating element, similar to the window element 160 of apparatus 100 and apparatus 200. The window element may be substantially transparent.

In some embodiments, apparatus 1003 may further include the one or more light-emitting devices, e.g., the light-emitting devices 400a, 400b, 400c and 400d, received in the recess of the base plate 402. The one or more light-emitting devices may be disposed between the base plate 402 and the cover element 401 and configured to receive electrical power from the first electrode 408 and the second electrode to emit light. The one or more light-emitting devices may include one or more VCEL or one or more LED.

It is noteworthy that, although the example apparatus 1003 shown in FIGS. 16-18 has the recess on the base plate 402, in alternative embodiments, it is the cover element 401 that has a recess configured to receive the one or more light-emitting devices therein. The recess, whether a feature on the base plate 402 or a feature on the cover element 401, allows passive alignment of the one or more light-emitting devices in a mass production setting in which light-emitting devices such as light-emitting devices 400a, 400b, 400c and 400d may simply be placed in the recess to be aligned with respect the entire package of apparatus 1003.

A unique feature in the design of apparatus 1003 is that cover element is electrically connected to the one or more light-emitting devices without any wire-bonding, and this improves thermal management. In this design, the light-emitting devices 400a, 400b, 400c and 400d are registered into the recess of the patterned cover element 401. The second electrode is soldered to the light-emitting devices 400a, 400b, 400c and 400d and the patterned silicon cover (401). The first electrode 408 is soldered to the light-emitting devices 400a, 400b, 400c and 400d and the base plate 402. The shim element 406 is also soldered between the cover element 401 and the base plate 402. The shim element 406 is configured to transfer thermal energy between the cover element 401 and the base plate 402. The shim element 406 is preferably a highly thermal conductive material such as, for example, copper, silver, crystal, silicon, diamond, carbon fiber, or carbon nanotubes. Alternatively, the shim element 406 may include SiO$_2$, SiN, or AlN.

Illustrative Seventh Thermal Energy Transfer Apparatus

FIGS. 21 and 22 illustrate a thermal energy transfer apparatus 1004 for one or more light-emitting devices in accordance with an embodiment of the present disclosure.

As shown in FIGS. 21 and 22, apparatus 1004 includes a non-metal base plate 455 and multiple non-metal cover elements 451, 452, 453 and 454. In some embodiments, base plate 455 may be silicon-based and made of single-crystal silicon. Alternatively, base plate 455 may be made of ceramic or another suitable non-metal material. For example, base plate 455 may include metal-core PCB, diamond, carbon-fiber, nanotubes, or thermally-conducting crystal. In some embodiments, at least one of the cover elements 451, 452, 453 and 454 may be silicon-based and made of single-crystal silicon. Alternatively, at least one of the cover elements 451, 452, 453 and 454 may be made of ceramic or another suitable non-metal material. As certain features of apparatus 1004 are similar to those of apparatus 1002, in the interest of brevity the description of apparatus 1004 is focused on features of apparatus 1004 different from those of apparatus 1002.

Similar to apparatus 1002, the base plate 455 and the cover elements 451, 452, 453 and 454 have electrically-conductive patterns thereon to supply power to one or more light-emitting devices (e.g., light-emitting devices 450*a*, 450*b*, 450*c* and 450*d*) when the light-emitting devices are disposed between the base plate 455 and the cover elements 451, 452, 453 and 454. One of such electrically-conductive patterns, electrically-conductive pattern 458, is shown in FIGS. 21 and 22. The electrically-conductive patterns are electrically connected to electrical pads 456 or 457, respectively, to form first and second electrodes and function as the cathode or anode.

In some embodiments, apparatus 1004 may further include the one or more light-emitting devices received in the recess of the cover elements 451, 452, 453 and 454. The one or more light-emitting devices are disposed between the base plate 455 and the cover elements 451, 452, 453 and 454, and receive electrical power from the electrodes to emit light. The one or more light-emitting devices may include one or more VCSEL or one or more LED.

In some embodiments, apparatus 1004 may further include an IC device 459 which is disposed on the base plate 455 and configured to receive electrical power from the electrodes to control operations of the one or more light-emitting devices 450*a*, 450*b*, 450*c* and 450*d*. The IC device 459 may be, for example, a power driver.

In apparatus 1004, having the IC device 459 and the light-emitting devices 450*a*, 450*b*, 450*c* and 450*d* mounted on the base plate 455 in close proximity (i.e., short distance therebetween) allows a fast signal switching on the light-emitting devices 450*a*, 450*b*, 450*c* and 450*d* for high peak power operation.

Illustrative Eighth Thermal Energy Transfer Apparatus

FIGS. 23 and 24 illustrate a thermal energy transfer apparatus 1005 for one or more light-emitting devices in accordance with another embodiment of the present disclosure.

As shown in FIGS. 23 and 24, apparatus 1005 includes a non-metal base plate 509 and multiple non-metal cover elements 501, 502, 503, 504, 505, 506, 507 and 508. In some embodiments, base plate 509 may be silicon-based and made of single-crystal silicon. In some embodiments, at least one of the cover elements 501, 502, 503, 504, 505, 506, 507 and 508 may be silicon-based and made of single-crystal silicon. Alternatively, at least one of the cover elements 501, 502, 503, 504, 505, 506, 507 and 508 may be made of ceramic or another suitable non-metal material. As certain features of apparatus 1005 are similar to those of apparatus 1004, in the interest of brevity the description of apparatus 1005 is focused on features of apparatus 1005 different from those of apparatus 1004.

Similar to apparatus 1004, the base plate 509 and the cover elements 501, 502, 503, 504, 505, 506, 507 and 508 have electrically-conductive patterns thereon (including, for example, electrical traces 513 and 563) to supply power to one or more light-emitting devices (e.g., light-emitting devices 500*a*, 500*b*, 500*c*, 500*d*, 500*e*, 500*f*, 500*g* and 500*h*) when the light-emitting devices are disposed between the base plate 509 and the cover elements 501, 502, 503, 504, 505, 506, 507 and 508. The electrically-conductive patterns are electrically connected to electrical pads 510 or 511, respectively, to form first and second electrodes and function as the cathode or anode.

In some embodiments, apparatus 1005 may further include the one or more light-emitting devices received in a recess of the base plate 509 or in a recess of the cover elements 501, 502, 503, 504, 505, 506, 507 and 508. The one or more light-emitting devices are disposed between the base plate 509 and the cover elements 501, 502, 503, 504, 505, 506, 507 and 508, and receive electrical power from the electrodes to emit light. The one or more light-emitting devices may include one or more VCSEL or one or more LED.

In some embodiments, apparatus 1005 may further include an IC device 512 which is disposed on the base plate 509 and configured to receive electrical power from the electrodes to control operations of the one or more light-emitting devices 500*a*, 500*b*, 500*c*, 500*d*, 500*e*, 500*f*, 500*g* and 500*h*. The IC device 509 may be, for example, a power driver.

The base plate 509 may be made with a single-crystal silicon for a high power illumination source. A whole single-crystal silicon wafer may be etched or patterned to make the base plate 509 suitable for several hundred watts of lighting power used in various industrial application such as warehouse lighting, street lighting, airport area, night-event sport area, shipyard and so on. One advantage of wafer level assembly is that the need for touch-labor is reduced to lower the manufacturing cost of the high-power lighting device encompassing apparatus 1005. Due to the high-precision silicon part, automation of the production of the high-power lighting device, which encompasses apparatus 1005, may be implemented relatively easily.

Illustrative Ninth Thermal Energy Transfer Apparatus

FIGS. 25-27 illustrate a thermal energy transfer apparatus 1006 for one or more light-emitting devices in accordance with yet another embodiment of the present disclosure.

As shown in FIGS. 25-27, apparatus 1006 includes a non-metal base plate 552 and non-metal cover element 551. In some embodiments, base plate 552 may include silicon, metal-core PCB, ceramics, diamond, carbon-fiber, nanotubes, or thermally-conducting crystal. In some embodiments, the cover element 551 may be silicon-based and made of single-crystal silicon. Alternatively, the cover element 551 may be made of ceramic or another suitable non-metal material. As certain features of apparatus 1006 are similar to those of apparatus 1005, in the interest of brevity the description of apparatus 1006 is focused on features of apparatus 1005 different from those of apparatus 1005.

Similar to apparatus 1005, the base plate 552 and the cover element 551 have electrically-conductive patterns thereon to supply power to one or more light-emitting devices (e.g., light-emitting devices 550a, 550b, 550c, 550d, 550e, 550f, 550g and 550h) when the light-emitting devices are disposed between the base plate 552 and the cover element 551. The electrically-conductive patterns are electrically connected to electrical pads 557 or 558, respectively, to form first and second electrodes and function as the cathode or anode.

In some embodiments, apparatus 1006 may further include the one or more light-emitting devices received in a recess of the base plate 552 or in a recess of the cover element 551. The one or more light-emitting devices are disposed between the base plate 552 and the cover element 551, and receive electrical power from the electrodes to emit light. The one or more light-emitting devices may include one or more VCSEL or one or more LED.

In some embodiments, apparatus 1006 may further include an IC device 553 which is disposed on the base plate 552 and configured to receive electrical power from the electrodes to control operations of the one or more light-emitting devices 550a, 550b, 550c, 550d, 550e, 550f, 550g and 550h. The IC device 553 may be, for example, a power driver.

In some embodiments, apparatus 1006 may further include a silicon-based heat sink 554 disposed on the IC device 553. The heat sink 554 may include a first primary surface and a second primary surface opposite the first primary surface thereof with the first primary surface of the heat sink facing the IC device 553. The second primary surface of the heat sink 554 may include a plurality of grooves to promote dissipation of thermal energy to the ambience via at least convection.

Compared to apparatus 1005, instead of having multiple cover elements (e.g., 501, 502 . . . 508), apparatus 1006 has a single silicon element 551 bonded with multiple light-emitting devices (e.g., light-emitting devices 550a, 550b, 550c, 550d, 550e, 550f, 550g and 550h) as shown in FIG. 25-27. Bonding all the light-emitting devices 550a, 550b . . . 550h with the cover element 551 simplifies the assembly process. The cover element 551 may be also bonded to a first heat sink 555 that is made of a single-crystal silicon and having a plurality of grooves for better heat transfer to the ambience via at least convection. Also, the base plate 552 may be mounted on a second heat sink 556 that is also made with a single-crystal silicon. Due to the large size of the high-power IC device 553, the separate heat sink 554 is mounted on the top of the IC device 553. Depending on the size of IC device 553, it can be also mounted on or integrated in the base plate 552 or the cover element 551. The first heat sink 555 may have a plurality of grooves thereon to promote dissipation of thermal energy to the ambience via at least convection. Similarly, the second heat sink 556 may have a plurality of grooves thereon to promote dissipation of thermal energy to the ambience via at least convection.

As shown in FIG. 27, the wafer-level assembly of the light-emitting devices 550a, 550b . . . 550h may be applied to any silicon wafer size and shape to build a light fixture for illumination application. The light fixture may be built for a few watts of light power to a several hundred watts or larger.

ADDITIONAL NOTES

The above-described techniques pertain to silicon-based thermal energy transfer apparatus, or cooling packages, for light-emitting devices. The novel thermal energy transfer apparatus advantageously removes thermal energy from one or more light-emitting devices and allows electrical power to be provided to the light-emitting device without using wire bonding.

Although the techniques have been described in language specific to structural features and/or methodological acts, it is to be understood that the appended claims are not necessarily limited to the specific features or acts described. Rather, the specific features and acts are disclosed as exemplary forms of implementing such techniques. Furthermore, although the techniques have been illustrated in the context of cooling package for a VCSEL, the techniques may be applied in any other suitable context such as, for example, cooling package for LED.

What is claimed is:

1. An apparatus, comprising:
a non-metal base plate, the base plate configured to receive one or more light-emitting devices thereon, a first area of the base plate coated with a first electrically-conductive pattern that forms a first electrode for powering the one or more light-emitting devices, a second area of the base plate coated with a second electrically-conductive pattern that is electrically isolated from the first electrically-conductive pattern; and
a silicon-based cover element, the cover element configured to be disposed on the base plate to hold the one or more light-emitting devices between the base plate and the cover element with at least a portion of a light-emitting surface of each of the one or more light-emitting devices exposed, an area of the cover element coated with a third electrically-conductive pattern that is in contact with the second electrically-conductive pattern to form a second electrode together with the second electrically-conductive pattern for powering the one or more light-emitting devices when the cover element is disposed on the base plate.

2. The apparatus as recited in claim 1, wherein the base plate comprises silicon, metal-core printed circuit board (PCB), ceramics, diamond, carbon-fiber, nanotubes, or thermally-conducting crystal.

3. The apparatus as recited in claim 1, wherein:
the base plate comprises a first primary surface and a second primary surface opposite to the first primary surface, the first primary surface comprising:
a non-recessed area and a recess configured to receive the one or more light-emitting devices in the recess,
at least a portion of the recess and a first portion of the non-recessed area contiguously coated with the first electrically-conductive pattern, and
a second portion of the non-recessed area coated with the second electrically-conductive pattern; and
the cover element comprises a first primary surface and a second primary surface opposite to the first primary surface, the first primary surface of the cover element coated with the third electrically-conductive pattern that is configured to be in contact with the second electrically-conductive pattern when the cover element is disposed on the base plate with the first primary surface of the cover element facing the first primary surface of the base plate.

4. The apparatus as recited in claim 3, wherein:
the recess comprises a main portion and a channel portion with the main portion dimensioned to receive the one or more light-emitting devices therein;
a first part of the first electrically-conductive pattern is disposed in the main portion and the channel portion of the recess;

a second part of the first electrically-conductive pattern that is contiguous with the first part of the first electrically-conductive pattern is disposed on the first portion of the non-recessed area of the first primary surface of the base plate; and the cover element is configured to be not in contact with the second part of the first electrically-conductive pattern when the cover element is disposed on the base plate.

5. The apparatus of claim 1, further comprising:
a layer of metallic material, disposed on at least a portion of the second primary surface of the base plate, that bonds the base plate to an external object.

6. The apparatus as recited in claim 1, further comprising:
a collimating element disposed on the cover element, the collimating element having a lens portion that collimates light emitted from the one or more light-emitting devices along a predefined direction.

7. The apparatus as recited in claim 6, wherein the collimating element is made of glass, polymer, or quartz.

8. The apparatus as recited in claim 6, further comprising:
a spacer element disposed on the collimating element with the collimating element disposed between the spacer element and the cover element, the spacer element having an opening that accommodates at least the lens portion of the collimating element and allows the light emitted from the one or more light-emitting devices to propagate through the spacer element.

9. The apparatus as recited in claim 8, wherein the spacer element is made of silicon or ceramic.

10. The apparatus as recited in claim 8, further comprising:
a window element disposed on the spacer element with the spacer element disposed between the window element and the collimating element, the window element being substantially transparent.

11. The apparatus as recited in claim 1, further comprising:
the one or more light-emitting devices, which are disposed between the base plate and the cover element and configured to receive electrical power from the first electrode and the second electrode to emit light, the one or more light-emitting devices comprising one or more vertical-cavity surface-emitting laser (VCSEL) or one or more light-emitting diodes (LED).

12. The apparatus as recited in claim 11, further comprising:
an integrated circuit (IC) device disposed on the base plate and configured to receive electrical power from the first electrode and the second electrode to control operations of the one or more light-emitting devices.

13. The apparatus of claim 12, further comprising:
a silicon-based heat sink disposed on the IC device, the heat sink having a first primary surface and a second primary surface opposite the first primary surface thereof with the first primary surface of the heat sink facing the IC device, the second primary surface of the heat sink comprising a plurality of grooves.

* * * * *